United States Patent
Sakaguchi et al.

(10) Patent No.: US 12,057,068 B2
(45) Date of Patent: Aug. 6, 2024

(54) ELECTRO-OPTICAL APPARATUS, ELECTRONIC EQUIPMENT, AND DRIVING METHOD

(71) Applicant: SONY SEMICONDUCTOR SOLUTIONS CORPORATION, Kanagawa (JP)

(72) Inventors: Takayuki Sakaguchi, Kanagawa (JP); Naobumi Toyomura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/756,445

(22) PCT Filed: Oct. 16, 2020

(86) PCT No.: PCT/JP2020/039021
§ 371 (c)(1),
(2) Date: May 25, 2022

(87) PCT Pub. No.: WO2021/111744
PCT Pub. Date: Jun. 10, 2021

(65) Prior Publication Data
US 2023/0005421 A1    Jan. 5, 2023

(30) Foreign Application Priority Data

Dec. 6, 2019    (JP) .................................. 2019-220844

(51) Int. Cl.
*G09G 3/3233*    (2016.01)
*G09G 3/20*    (2006.01)

(52) U.S. Cl.
CPC ......... *G09G 3/3233* (2013.01); *G09G 3/2007* (2013.01); *G09G 2300/0819* (2013.01);
(Continued)

(58) Field of Classification Search
None
See application file for complete search history.

(56) References Cited

U.S. PATENT DOCUMENTS

| 2013/0241906 A1* | 9/2013 | Asano | G09G 3/3233 345/82 |
| 2016/0155379 A1* | 6/2016 | Na | G09G 3/3233 345/215 |
| 2019/0279568 A1* | 9/2019 | Ota | G09G 3/3291 |

FOREIGN PATENT DOCUMENTS

| JP | 2008-197516 A | 8/2008 |
| JP | 2012-255873 A | 12/2012 |

(Continued)

OTHER PUBLICATIONS

International Search Report and Written Opinion of PCT Application No. PCT/JP2020/039021, issued on Nov. 24, 2020, 08 pages of ISRWO.

*Primary Examiner* — Ifedayo B Iluyomade
(74) *Attorney, Agent, or Firm* — CHIP LAW GROUP

(57) ABSTRACT

An electro-optical apparatus includes selector switches. One selector switch is provided for each data line. One data line is disposed for each pixel column of a pixel section that includes pixel circuits that are arranged in a matrix form. Each of the pixel circuits includes a drive transistor and a light-emitting element that emits light at luminance that is commensurate with a magnitude of a current supplied via the drive transistor. The selector switches write an input data signal to the data lines. The selector switches write a correction potential for correcting a threshold voltage of the drive transistor to the data lines that are divided into groups, at a timing different for each group.

12 Claims, 18 Drawing Sheets

(52) U.S. Cl.
CPC . *G09G 2300/0852* (2013.01); *G09G 2310/08* (2013.01); *G09G 2320/043* (2013.01); *G09G 2330/021* (2013.01)

(56) References Cited

FOREIGN PATENT DOCUMENTS

| | | |
|---|---|---|
| JP | 2013-097100 A | 5/2013 |
| JP | 2019-082548 A | 5/2019 |
| KR | 10-2008-0009925 A | 1/2008 |
| WO | 2019/087950 A1 | 5/2019 |

\* cited by examiner

4d

ELECTRO-OPTICAL APPARATUS, ELECTRONIC EQUIPMENT, AND DRIVING METHOD

CROSS REFERENCE TO RELATED APPLICATIONS

This application is a U.S. National Phase of International Patent Application No. PCT/JP2020/039021 filed on Oct. 16, 2020, which claims priority benefit of Japanese Patent Application No. JP 2019-220844 filed in the Japan Patent Office on Dec. 6, 2019. Each of the above-referenced applications is hereby incorporated herein by reference in its entirety.

TECHNICAL FIELD

The present technology relates to an electro-optical apparatus, electronic equipment, and a driving method.

BACKGROUND ART

There are known electro-optical apparatuses that use an organic light-emitting diode (hereinafter referred to as an OLED) element or the like as a light-emitting element. In the electro-optical apparatus, pixel circuits each including a light-emitting element, a transistor, and the like are provided to correspond to pixels at intersections between scan lines and data lines. When a data signal whose potential is commensurate with a gray scale level of a pixel is applied to a gate of the transistor of the pixel circuit, the transistor supplies a current commensurate with a voltage between the gate and a source to the light-emitting element, which causes the light-emitting element to emit light at luminance commensurate with the gray scale level.

Variations of a threshold voltage (hereinafter referred to as Vth as appropriate) of the transistor provided in each pixel cause the current flowing through the light-emitting element to vary, which leads to image quality degradation. In order to prevent the image quality degradation, it is necessary to correct the variations of Vth. There is known a technique that corrects the variations of Vth by writing, to the gate of the transistor, a correction potential (reference voltage) for correcting the variations of Vth of the transistor in question (refer, for example, to PTL 1 listed below).

CITATION LIST

Patent Literature

[PTL 1]
Japanese Patent Application Laid-Open No. 2008-197516

SUMMARY

Technical Problem

Although being able to correct the variations of Vth on a pixel-by-pixel basis, such an art in the past is unable to provide a sufficient ameliorating effect on partial deterioration of the image quality on a screen.

It is an object of the present technology to provide an electro-optical apparatus, electronic equipment, and a driving method which can improve the partial deterioration of the image quality on the screen.

Solution to Problem

The present technology is an electro-optical apparatus that includes selector switches each of which is provided for each data line, one data line being disposed for each pixel column of a pixel section that includes pixel circuits arranged in a matrix form, each of the pixel circuits including a drive transistor and a light-emitting element that emits light at luminance that is commensurate with a magnitude of a current supplied via the drive transistor, each of the selector switches writing an input data signal to the data lines. The selector switches write a correction potential for correcting a threshold voltage of the drive transistor to the data lines that are divided into groups, at a timing different for each group.

Also, the present technology is electronic equipment that includes the above electro-optical apparatus.

Further, the present technology is a driving method of an electro-optical apparatus. The driving method includes dividing, into groups, data lines that are disposed one for each pixel column of a pixel section that includes pixel circuits that are arranged in a matrix form, each of the pixel circuits including a drive transistor and a light-emitting element that emits light at luminance that is commensurate with a magnitude of a current supplied via the drive transistor, and writing a correction potential for correcting a threshold voltage of the drive transistor to the data lines, at a timing different for each group.

DESCRIPTION OF EMBODIMENT

An embodiment which will be described below are preferred specific examples of the present technology and has various technically preferred limitations. However, the scope of the present technology is not limited to these embodiments unless otherwise specified in the following description. Also, in the following description, the same names and reference signs represent the same or similar components, and redundant description will be omitted as appropriate. The description of the present technology will be given in the following order.

<1. Electro-optical apparatus to which present technology is applicable>
"1-1. Configuration of electro-optical apparatus"
"1-2. Configuration of horizontal drive circuit"
"1-3. Configuration of pixel circuit"
"1-4. Basic circuit operation"
"1-5. Improvement"
<2. Embodiment of present technology>
<3. Modification examples>
<4. Application example>

1. ELECTRO-OPTICAL APPARATUS TO WHICH PRESENT TECHNOLOGY IS APPLICABLE

"1-1. Configuration of Electro-Optical Apparatus"

Figure 1:
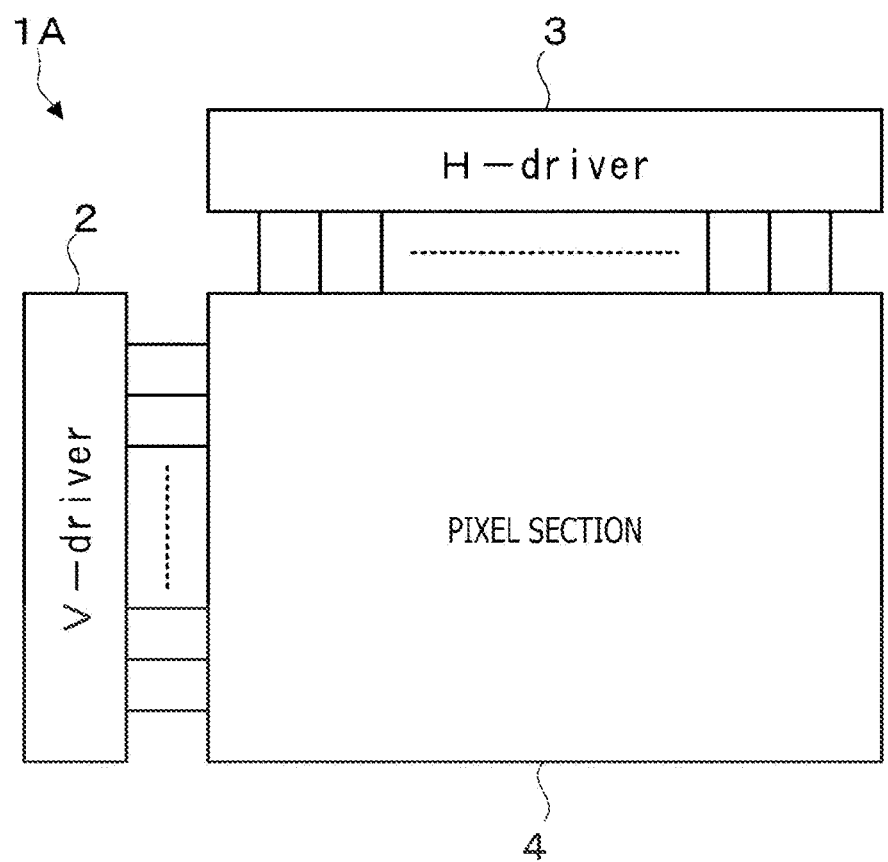
FIG. 1 is a block diagram of an organic EL display apparatus that includes an active-matrix drive circuit to which the present technology is applicable.

The present technology is applicable to an organic EL display apparatus 1 (electro-optical apparatus) having an active-matrix drive circuit illustrated in FIG. 1. The organic EL display apparatus 1 includes a display panel 1A and a control circuit (not illustrated) that controls operation of the display panel 1A.

The control circuit is supplied with digital image data synchronously with a data synchronizing signal. The image data is data that defines gray scale levels of pixels of an image to be displayed on the display panel 1A, for example, by eight bits. Also, the synchronizing signal refers to a signal that includes a vertical synchronizing signal, a horizontal synchronizing signal, and a dot clock signal. The control circuit generates various control signals on the basis of the synchronizing signal and supplies these control signals to the display panel 1A. Also, the control circuit includes a voltage generation circuit. The voltage generation circuit supplies various potentials to the display panel 1A. Further, the control circuit generates an analog image signal on the basis of the image data.

As illustrated in FIG. 1, the display panel 1A has a vertical drive circuit 2, a horizontal drive circuit 3, and a pixel section 4 that are formed on a semiconductor substrate such as a silicon substrate. A plurality of scan lines is horizontally extended from the vertical drive circuit 2 to the pixel section 4, and a plurality of data lines is vertically extended from the horizontal drive circuit 3 to the pixel section 4.

Figure 2:
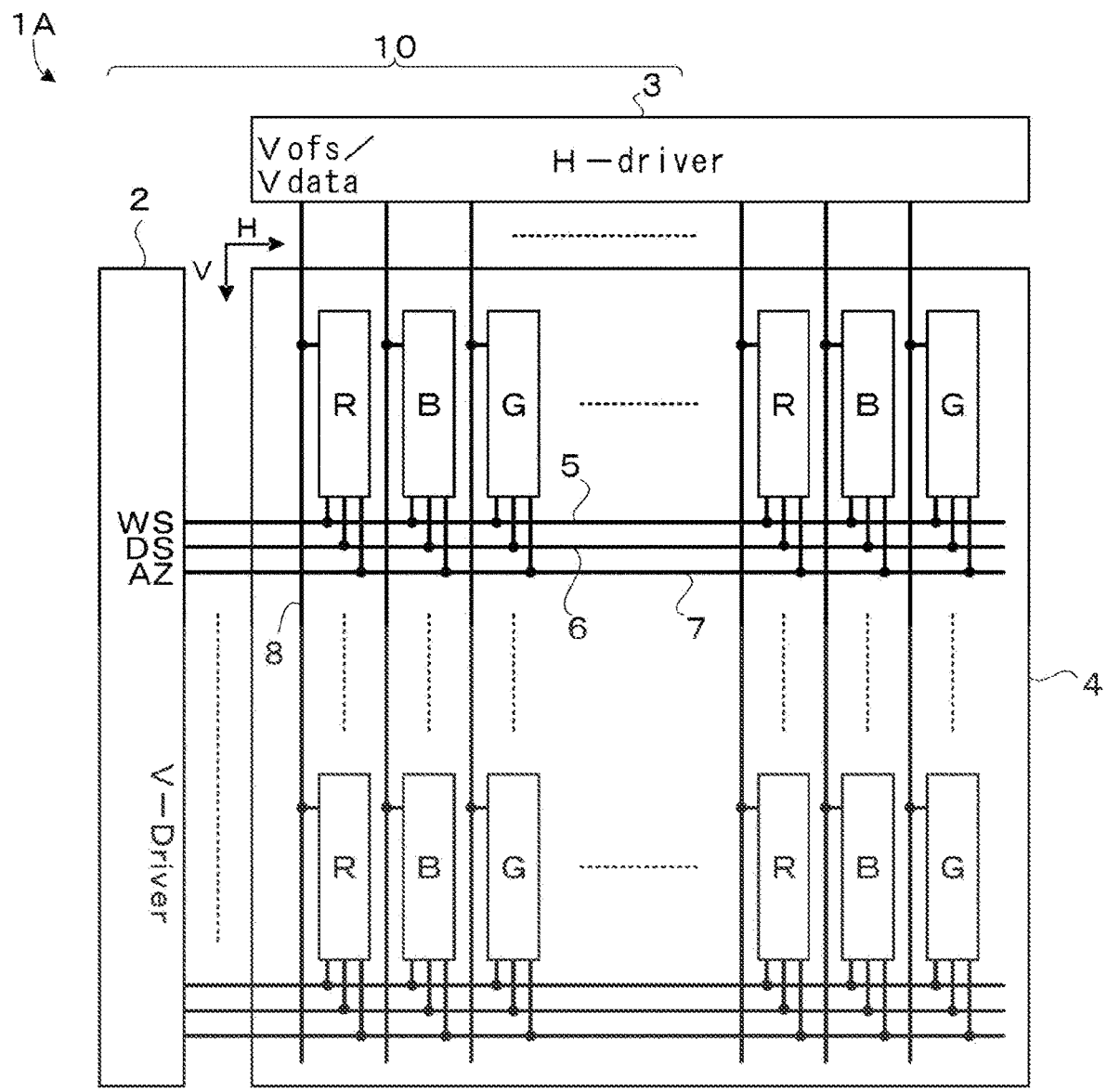
FIG. 2 is a block diagram illustrating a configuration of a pixel section of the organic EL display apparatus.

As illustrated in FIG. 2, the pixel section 4 has pixel circuits that are arranged in a matrix form. Then, in the pixel section 4, three scan lines (a first scan line 5, a second scan line 6, and a third scan line 7) are disposed in a row direction (direction in which the pixels in pixel rows are arranged) for each pixel row in the matrix arrangement of the pixel circuits. Also, a data line 8 is disposed in a column direction (direction in which the pixels in pixel columns are arranged) for each pixel column in the matrix arrangement of the pixel circuits. It should be noted that the pixel circuits corresponding to the pixels of three primary colors are provided in the pixel section 4 as illustrated by R (red), B (blue), and G (green). These three pixels express one dot of a color image. It should be noted that the combination of the pixels for expressing one dot is not limited thereto, and a W (white) pixel for improving luminance may be added. Alternatively, a complementary color pixel for expanding a color reproduction range may be added.

Each of the first scan lines 5, each of the second scan lines 6, and each of the third scan lines are connected to corresponding output ends of the rows of the vertical drive circuit 2, respectively. Each of the data lines 8 is connected to a corresponding output end of the column of the horizontal drive circuit 3.

The vertical drive circuit 2 includes shift register circuits and the like. The vertical drive circuit 2 scans each of the pixel circuits of the pixel section 4 in rotation on a row-by-row basis by sequentially supplying a writing scan signal WS to each of the first scan lines 5 (line sequential scan) when a data signal commensurate with the gray scale level is written to each of the pixel circuits of the pixel section 4. Also, the vertical drive circuit 2 controls the pixel circuits to emit or not to emit light (extinguish light) by supplying a first control signal DS to the second scan line 6. Further, the vertical drive circuit 2 controls the pixel circuits not to emit light during a non-light-emission period, by supplying a second control signal AZ to the third scan line 7.

The horizontal drive circuit 3 selectively writes, as the data signal, a signal potential (signal voltage Vdata) of the data signal commensurate with the gray scale level described above and a correction potential (reference voltage Vofs) to each of the data lines 8. That is, the signal voltage Vdata is a voltage commensurate with the gray scale level (luminance). The reference voltage Vofs is used when threshold correction operation which will be described later is performed.

The characteristic of the present technology lies in specific circuit operation of the horizontal drive circuit 3, and a detailed description thereof will be given later.

The data signal output from the horizontal drive circuit 3 is written to each pixel circuit of the pixel section 4 via each data line 8 in units of pixel rows selected through a scan by the vertical drive circuit 2. That is, the horizontal drive circuit 3 adopts, as a manner of driving, line sequential writing in which the data signal is sequentially written on a row-by-row (line-by-line) basis.

Then, the vertical drive circuit 2 and the horizontal drive circuit 3 are included in a drive circuit 10 that drives the pixel section 4 to perform, on each pixel circuit, writing operation of the data signal to a retention capacitance, threshold correction operation, mobility correction operation, and bootstrap operation which will be described later.

"1-2. Configuration of Horizontal Drive Circuit"

Figure 3:
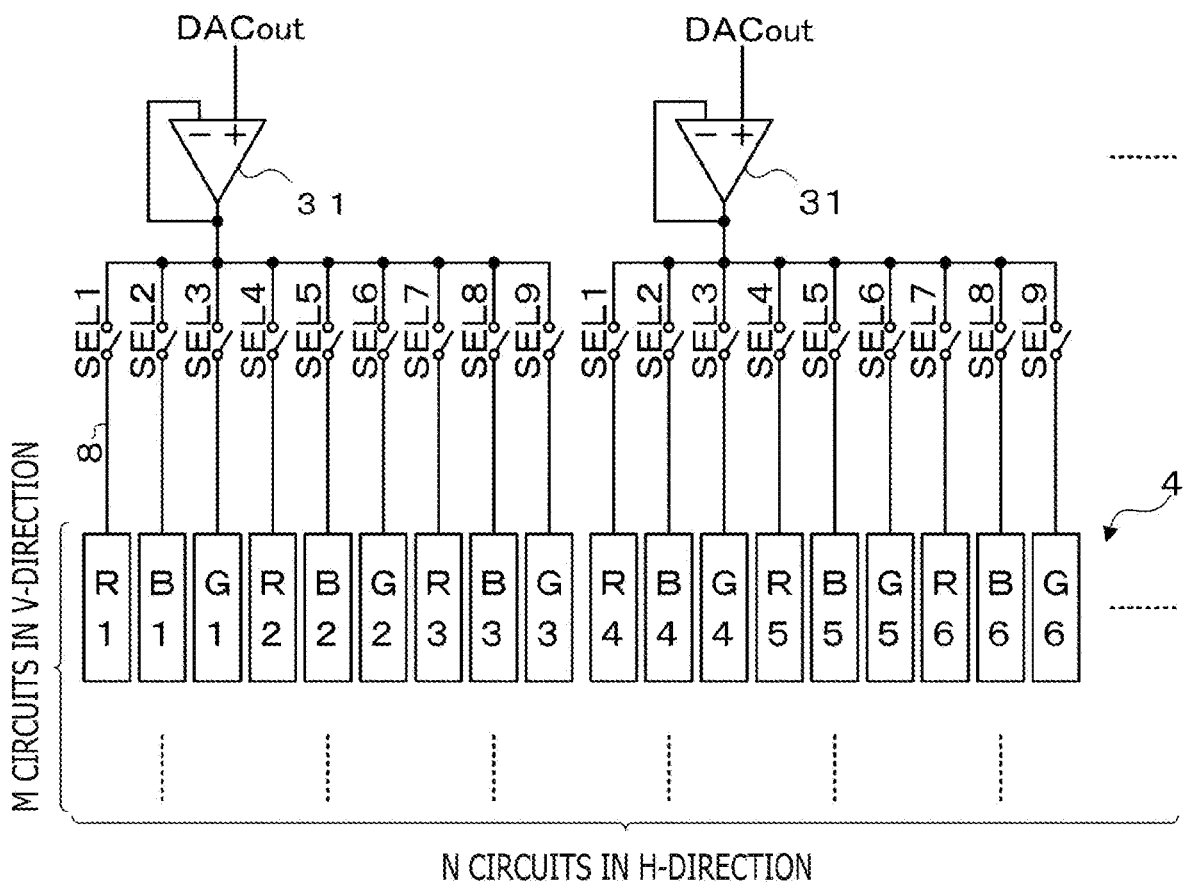
FIG. 3 is a diagram schematically illustrating an example of a connection configuration between a horizontal drive circuit and pixel circuits.

FIG. 3 is a diagram schematically illustrating an example of a connection configuration between the horizontal drive circuit and the pixel circuits. As described earlier, the pixel circuits are connected in the row direction (horizontally in FIG. 3) and in the column direction (vertically in FIG. 3) in an array form, and three pixels of R(red), B (blue), and G (green) are treated as a unit. In the example illustrated, one unit (one screen) includes N pixel circuits in the row direction and M pixel circuits in the column direction. Each of the pixel circuits is connected to the data line 8 that is extended in the column direction. To the data lines 8, the data signal potential (signal voltage Vdata) commensurate with the luminance and the correction potential (reference voltage Vofs) are vertically written line by line with respect to the pixel circuits that are arranged in a matrix form.

Then, in the horizontal drive circuit 3, an input voltage is given to each of the N data lines 8 in the pixel section 4 from an amplifier 31, with one data line 8 being used as one unit, as illustrated in FIG. 3.

The input voltages given by the amplifier 31 are the reference voltage Vofs which is a given DC voltage and the signal voltages (gray scale level voltages) Vdata for the N columns that are input chronologically following the reference voltage Vofs. On a previous stage side of the amplifier 31, for example, a DA converter (not illustrated) for converting a digital signal into an analog signal is provided, and an output DACout of the DA converter is input to a non-inverting (+) input terminal of the amplifier 31.

The DA converter is included in a signal supply source that supplies the reference voltage Vofs and the signal voltages Vdata to the horizontal drive circuit 3. An inverting (−) input terminal and an output terminal of the amplifier 31 are electrically connected to each other and included in an output stage of the signal supply source that includes the DA converter.

In general, one signal supply source is provided in one-to-one correspondence with each of the N data lines 8 of the pixel section 4. In contrast, the provision of one signal supply source for every nine data lines 8 as one unit as in the horizontal drive circuit 3 makes it possible to significantly reduce the number of signal supply sources, i.e., DA converters and amplifiers 31, which is advantageous in that a system circuit configuration can be simplified.

The horizontal drive circuit 3 has selector switches (selector switches SEL1 to SEL9) each of which corresponds to one of the nine data lines 8. The selector switches SEL1 to SEL9 are included in a selector circuit together with the data lines 8 and sample the reference voltage Vofs input from the amplifiers 31 and write the reference voltage Vofs to the data lines 8. Further, the selector switches SEL1 to SEL9 sample, in a time-shared manner, the signal voltages Vdata that are input chronologically from the amplifiers 31 following the reference voltage Vofs and write the signal voltages Vdata to the respective data lines 8.

The selector switches SEL1 to SEL9 each include, for example, an analog switch (transfer switch) using a p-channel transistor or the like. Then, the selector switches SEL1 to SEL9 sample and hold the reference voltage Vofs and the signal voltages Vdata by performing switching operation (ON/OFF operation) in response to a selection pulse (generated, for example, by the horizontal drive circuit or the control circuit) supplied via control lines (not illustrated) that are connected to the respective selector switches.

As described above, when the data signal is written to the pixel circuit, the horizontal drive circuit 3 turns ON a selector line that is connected to that pixel circuit. That is, the data signal can be written to the pixels R1, R4, and so on by turning ON the selector switches SEL1, and the data signal can next be written to the pixels B1, B4, and so on by turning ON the selector switches SEL2. The writing to one horizontal line is complete when the data signals Vdata are written up to the selector switch SEL9 during a horizontal period, and this operation is repeated for each vertical line.

It should be noted that, although a configuration in which N horizontal pixel circuits are provided per unit and M vertical pixel circuits are provided per unit and in which every nine selector switches (selector switches SEL1 to SEL9) are connected to one amplifier 31 (number of amplifiers: N/9) is illustrated, the number of selector switches connected to the amplifier 31 is not limited thereto. That is, the number of data lines 8 for each amplifier line (output line of the amplifier 31) may be a number other than nine.

"1-3. Configuration of Pixel Circuit"

Figure 4:
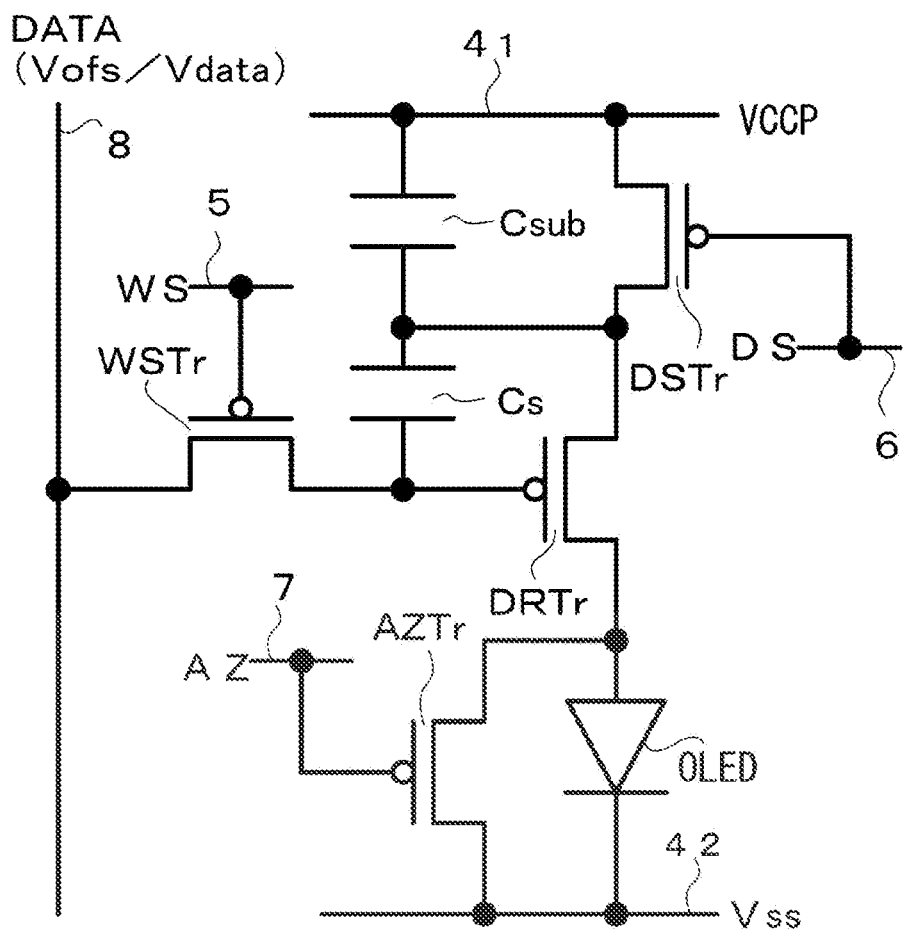
FIG. 4 is a diagram illustrating an example of a configuration of a pixel circuit to which the present technology is applicable.

FIG. 4 illustrates a pixel circuit 4a of one pixel. The pixel circuit 4a is connected to the first scan line 5, the second scan line 6, and the third scan line 7 from the vertical drive circuit 2 and the data line 8 from the horizontal drive circuit 3. The pixel circuit 4a includes four transistors (a drive transistor DRTr, a transistor WSTr, a transistor DSTr, and a transistor AZTr), a retention capacitance Cs, an auxiliary capacitance Csub, and an OLED. It should be noted that p-channel transistors are used as these four transistors here. That is, the pixel circuit 4a includes four p-channel transistors and two capacitances.

The drive transistor DRTr has a source connected to a power feed line 41 via the transistor DSTr and a drain connected to an anode of the OLED and controls the current flowing through the OLED. High-potential power (VCCP) is fed to the power feed line 41. A cathode of the OLED is connected to a power line 42 for use as a common electrode and set to low-potential power (Vss).

The transistor WSTr (first transistor) has a gate connected to the first scan line 5, one of a source and a drain connected to the data line 8, and the other of the source and the drain connected to a gate of the drive transistor DRTr. The transistor WSTr writes a data line potential (gray scale level potential) to the gate of the drive transistor DRTr in response to the writing scan signal WS.

The transistor DSTr (second transistor) has a gate connected to the second scan line 6, one of a source and a drain connected to the power feed line 41, and the other of the source and the drain connected to the source of the drive transistor DRTr and controls the supply of power to the drive transistor DRTr.

The transistor AZTr (third transistor) has a gate connected to the third scan line 7, one of a source and a drain connected to the drain of the drive transistor DRTr and the anode of the OLED, and the other of the source and the drain connected to the power line 42.

The retention capacitance Cs is connected between the gate and the source of the drive transistor DRTr and retains a gate-to-source voltage Vgs of the DRTr. The auxiliary capacitance Csub is connected between the source of the drive transistor DRTr and a node of the fixed power supply (Vss) and has an action of suppressing a change of the source voltage of the drive transistor DRTr and bringing the gate-to-source voltage Vgs of the drive transistor DRTr to a threshold voltage Vth of the drive transistor DRTr.

"1-4. Basic Circuit Operation"

In the organic EL display apparatus 1 having the above configuration, light emission luminance of the OLED in each pixel circuit 4a is controlled by the current that is controlled by the drive transistor DRTr. Accordingly, if the threshold voltage Vth of the drive transistor DRTr varies in each pixel circuit 4a, the light emission luminance varies from one pixel to another, which leads to loss of screen uniformity. Therefore, the organic EL display apparatus 1 performs, together with the line sequential scan, Vth correction operation that reduces the variations of the light emission luminance caused by the variations of the threshold voltage Vth of the drive transistor DRTr.

The period for correcting Vth of the drive transistor DRTr includes a Vth correction preparation period and a Vth correction period. The Vth correction preparation refers to initialization of the gate voltage of the drive transistor DRTr and initialization of a source voltage of the drive transistor DRTr. The Vth correction refers to correction operation that brings the gate-to-source voltage Vgs of the drive transistor DRTr close to the threshold voltage Vth of the drive transistor DRTr.

Figure 5:
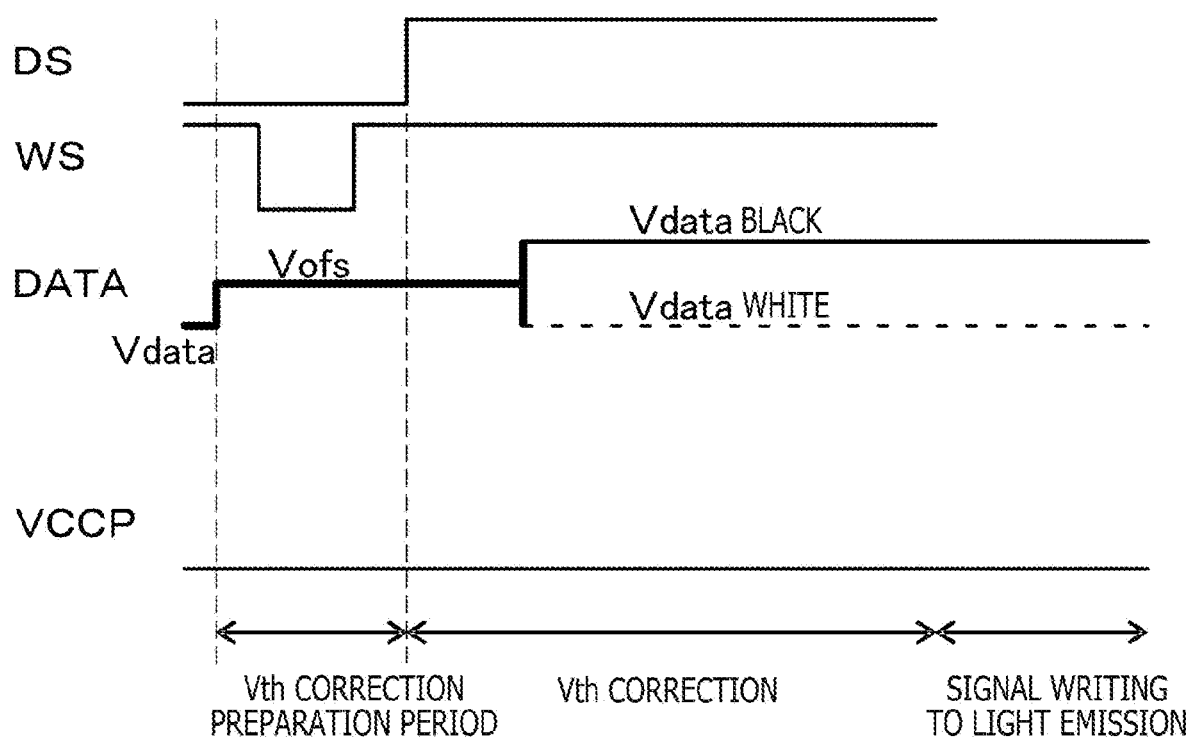
FIG. 5 is a diagram illustrating an example of a driving timing of the pixel circuit from a Vth correction preparation period of a drive transistor to writing of a data signal commensurate with a gray scale level.

FIG. 5 is a diagram illustrating an example of a driving timing of the pixel circuit 4a from the Vth correction preparation period of the drive transistor DRTr to the writing of the data signal commensurate with the gray scale level. First, a transition to the Vth correction preparation period takes place when a new field for the line sequential scan is entered. During the Vth correction preparation period, the reference voltage Vofs is written to the data line 8 by the horizontal drive circuit 3. In this state, the transistor WSTr (refer to FIG. 4) is turned ON by the writing scan signal WS from the vertical drive circuit 2, which brings a gate voltage Vg of the drive transistor DRTr to the reference voltage Vofs and initializes (resets) the gate voltage Vg. At this time, the transistor DSTr is turned ON by the first control signal DS from the vertical drive circuit 2, which brings the source voltage of the drive transistor DRTr to the power supply voltage VCCP and initializes (resets) the source voltage. This completes the Vth correction preparation.

When the Vth correction preparation is complete, a transition to the Vth correction period takes place. During the Vth correction period, the transistor DSTr is turned OFF by the first control signal DS from the vertical drive circuit 2. This causes the source voltage of the drive transistor DRTr to start to decrease, and the gate-to-source voltage Vgs converges to the threshold voltage Vth. The voltage corresponding to this threshold voltage Vth is retained by the retention capacitance Cs. It should be noted that the horizontal drive circuit 3 switches the voltage to be written to the data line 8 from the reference voltage Vofs to the signal voltage Vdata during the Vth correction period.

The retention of the voltage corresponding to the threshold voltage Vth by the retention capacitance Cs suppresses dependence of a drain-to-source current Ids flowing through the drive transistor DRTr on the threshold voltage Vth when the drive transistor DRTr is driven by the signal voltage Vdata.

It should be noted that, although not described here, the drive circuit 10 that includes the vertical drive circuit 2 and the horizontal drive circuit 3 drives the pixel section 4 to further perform the mobility correction operation and the bootstrap operation as well, as described above. The mobility correction operation is operation that corrects the voltage Vgs retained between the gate and the source of the drive transistor DRTr, commensurate with a magnitude of the mobility of the drive transistor DRTr. The bootstrap operation is operation that changes a gate potential Vg and a source potential Vs of the drive transistor DRTr while retaining the gate-to-source voltage Vgs retained by the retention capacitance Cs, i.e., the voltage across the retention capacitance Cs.

"1-5. Improvement"

Figure 6:
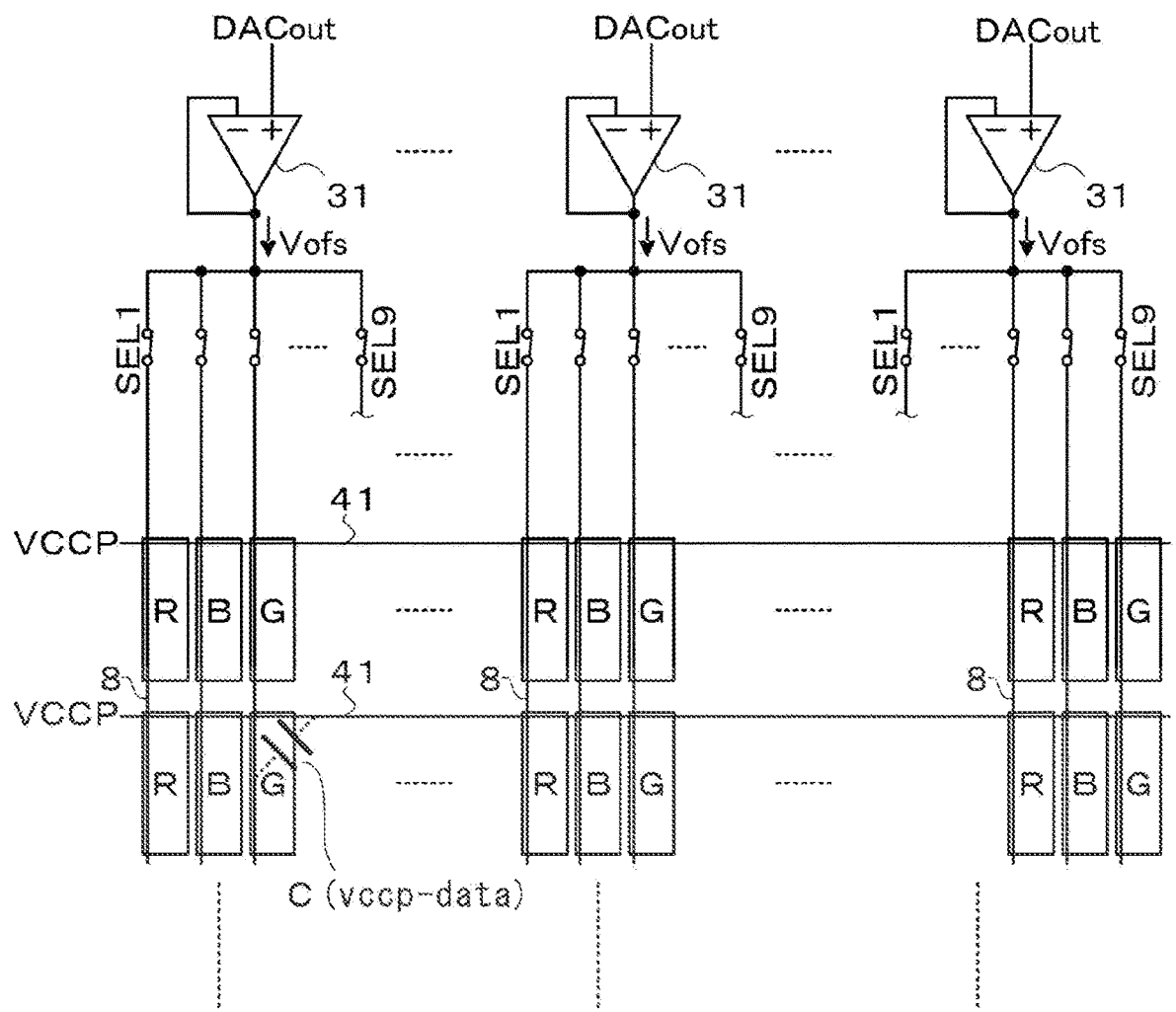
FIG. 6 is a diagram for describing writing of a correction potential to a data line in a comparative example.

FIG. 6 is a diagram for describing the writing of the correction potential to the data line 8 in a comparative example. The above horizontal drive circuit 3 writes the reference voltage Vofs to the data lines 8 on a single horizontal line in one operation during the Vth correction preparation period. That is, as illustrated in FIG. 6, the horizontal drive circuit 3 turns ON all the selector switches SEL1 to SEL9 that are connected to the respective amplifiers 31, at the same time. This results in image quality degradation caused by crosstalk which will be described below.

Figure 7:
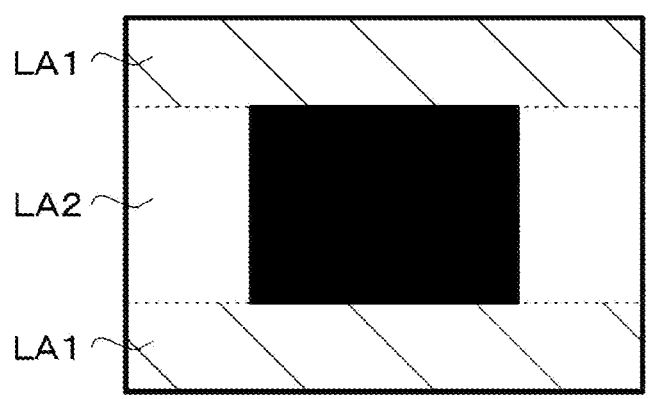
FIG. 7 is a diagram for describing a crosstalk pattern in the writing in the comparative example.

FIG. 7 is a diagram for describing a crosstalk pattern in the writing in the comparative example. For example, it is assumed that, as illustrated in FIG. 7, an outside portion of a window is displayed with a white pattern and an inner portion thereof is displayed with a black pattern when the window is displayed at a center portion of the screen. In this case, the following phenomenon occurs: white tier portions LA1 (line regions including only the white pattern) are displayed darker than a window tier portion (line region including the black pattern) LA2 due to fluctuation of the power supply (VCCP in the present example) potential during the Vth correction preparation period. That is, even in the case where the data signals Vdata having the same luminance are written to the data lines 8 from the horizontal drive circuit 3, a phenomenon in which the luminance varies from one pixel row to another occurs. A description will be given below of the cause thereof.

Figure 8:
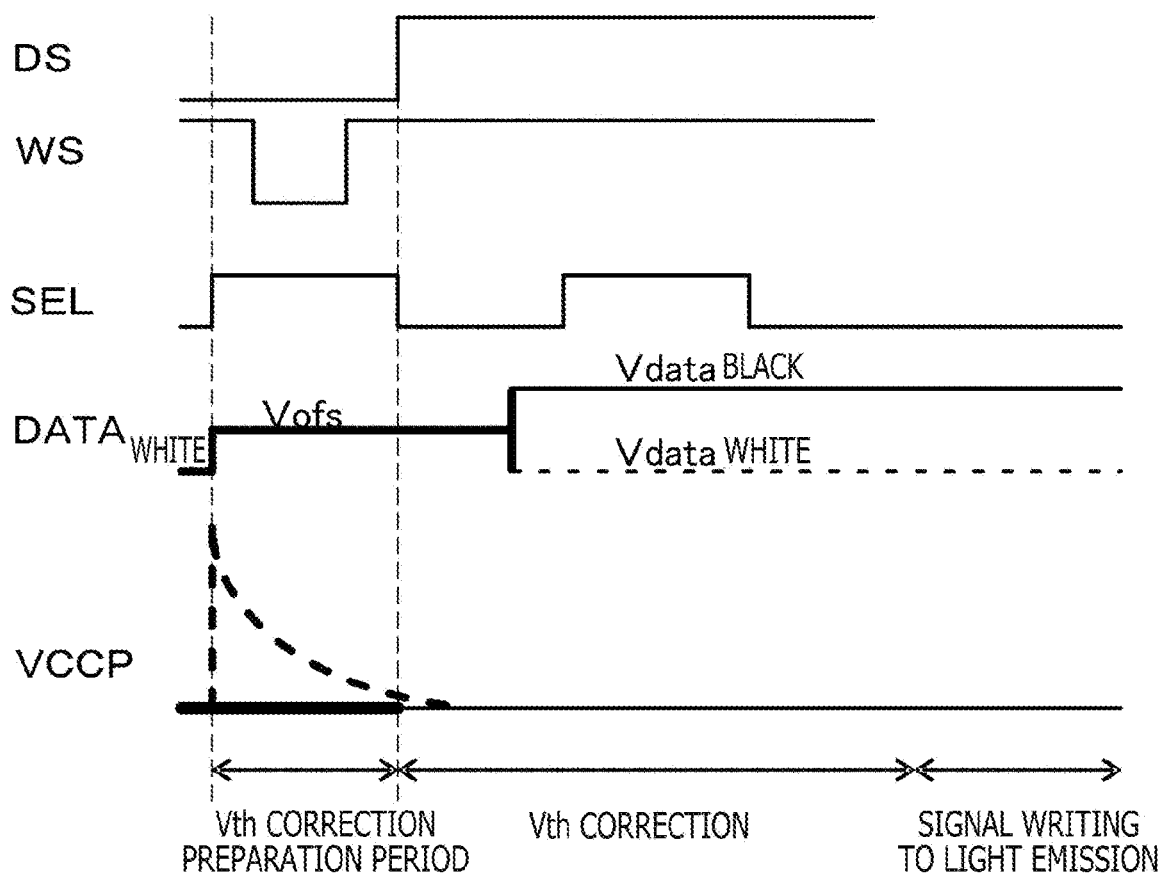
FIG. 8 is a diagram for describing a problem caused by fluctuation of a power supply potential during the Vth correction preparation period.

FIG. 8 is a diagram for describing a problem caused by the fluctuation of the power supply potential during the Vth correction preparation period. It should be noted that, in FIG. 8, Vdata (white) is the voltage written to the data line 8 when light is emitted at given luminance and Vdata (black) is the voltage written to the data line 8 when black light is emitted. This also holds true for FIG. 5 that is used in the above description. Also, a description will be given of the case where a voltage magnitude relation is Vdata (white) <Vofs<Vdata (black).

Figure 9:
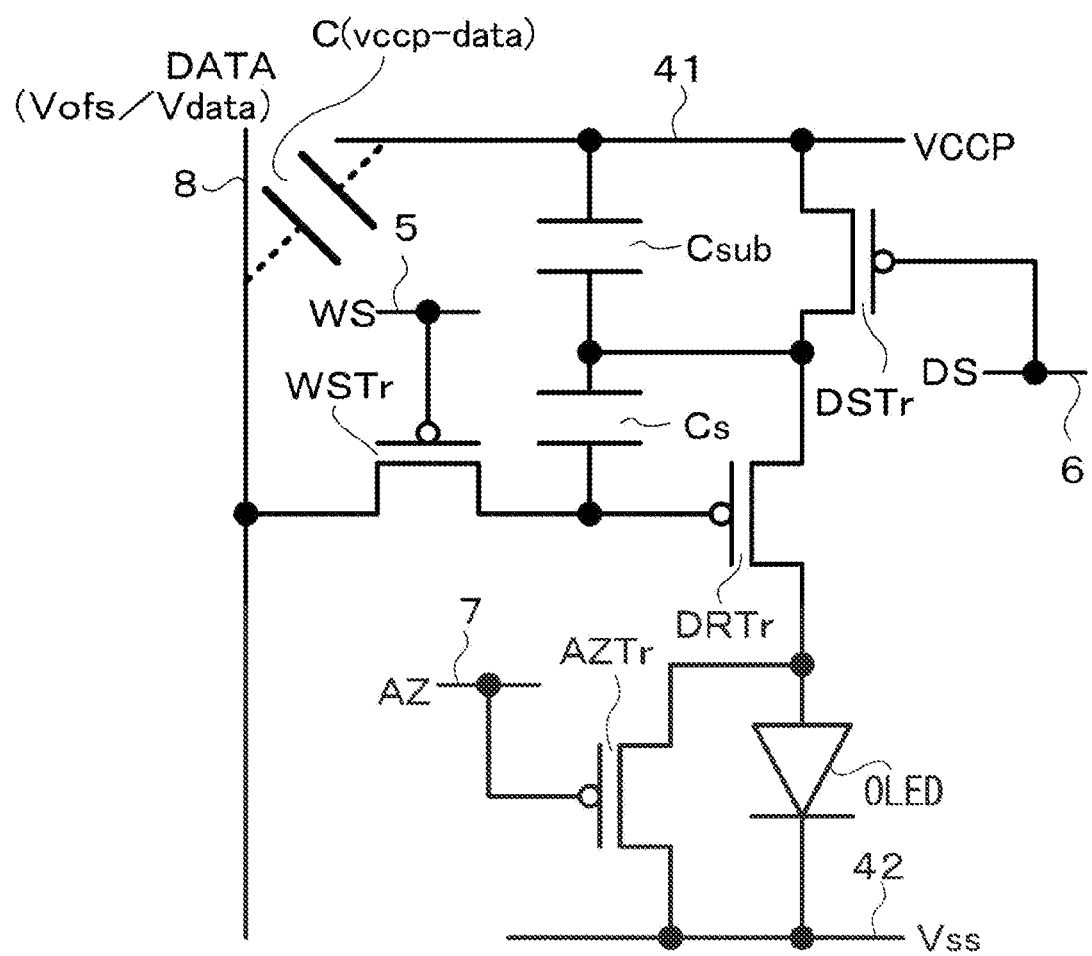
FIG. 9 is a diagram for describing parasitic capacitance between the power supply and a data line.

During the Vth correction preparation period of the white tier portions LA1, a potential change occurs simultaneously on one horizontal line from the signal potential of the data signal on the previous vertical line (signal voltage Vdata (white)) to the correction potential (reference voltage Vofs). This potential change causes the fluctuation of the VCCP power, as illustrated by a bold dashed line waveform in FIG. 8, via a parasitic capacitance C (vccp-data) (refer to FIGS. 6 and 9) between VCCP and DATA (between the power feed line 41 of the power supply VCCP and the data line 8).

Meanwhile, in the window tier portion LA2, the potential change from the signal potential of the data signal on the previous vertical line (signal voltage Vdata (black)) to the correction potential (reference voltage Vofs) and the potential change from the signal potential of the data signal on the previous vertical line (signal voltage Vdata (white)) to the correction potential (reference voltage Vofs) occur (specifically, occur to the same extent), eventually cancelling out the power fluctuations on the one horizontal line. Accordingly, the VCCP waveform is as illustrated by a bold line (solid line) and is the VCCP power fluctuation different from that in the white tier portions LA1.

Due to this VCCP potential difference between the white tier portions LA1 and the window tier portion LA2, the source voltage Vs of the drive transistor DRTr changes at the beginning of the Vth correction. That is, a screen as illustrated in FIG. 7 is displayed due to the change of the gate-to-source voltage Vgs of the drive transistor DRTr. It should be noted that even the case where the voltage magnitude relation is Vofs<Vdata (white)<Vdata (black) can be explained by a similar reason.

That is, as illustrated in FIG. 6, the VCCP potential fluctuation has become likely to occur as a result of the writing of the reference voltage Vofs to the one horizontal line in one operation, which can lead to crosstalk. The present technology can improve the deterioration of the image quality that occurs in such a manner.

2. EMBODIMENT OF PRESENT TECHNOLOGY

The organic EL display apparatus 1 according to an embodiment of the present technology divides the data lines 8 into groups in the above configuration and writes a correction potential (reference voltage Vofs) for correcting Vth of the drive transistor DRTr at a timing different for each group. A description will be given below with reference to the drawings.

Figure 10:
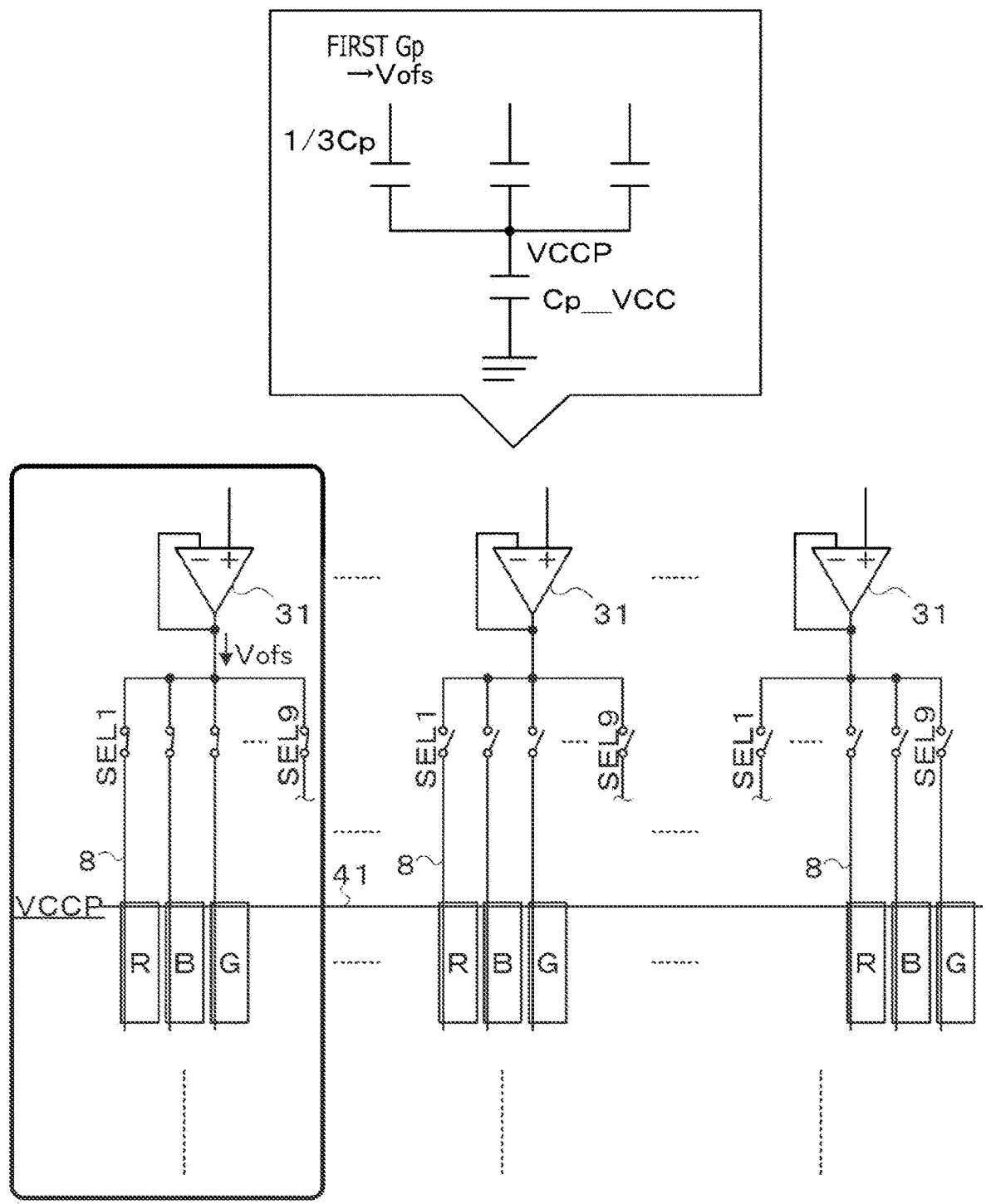
FIG. 10 is a diagram for describing correction potential writing operation (first group).
Figure 11:
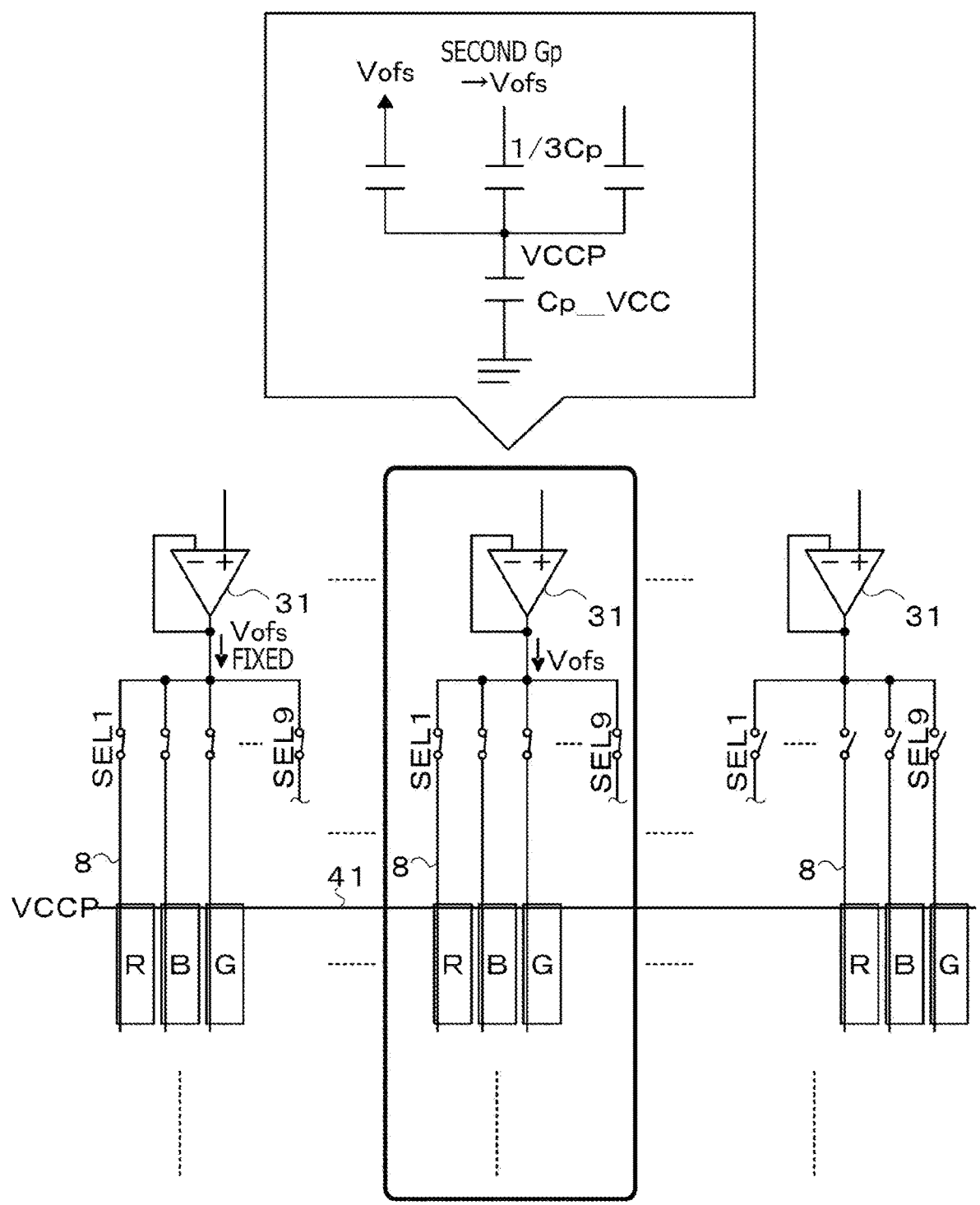
FIG. 11 is a diagram for describing the correction potential writing operation (second group).
Figure 12:
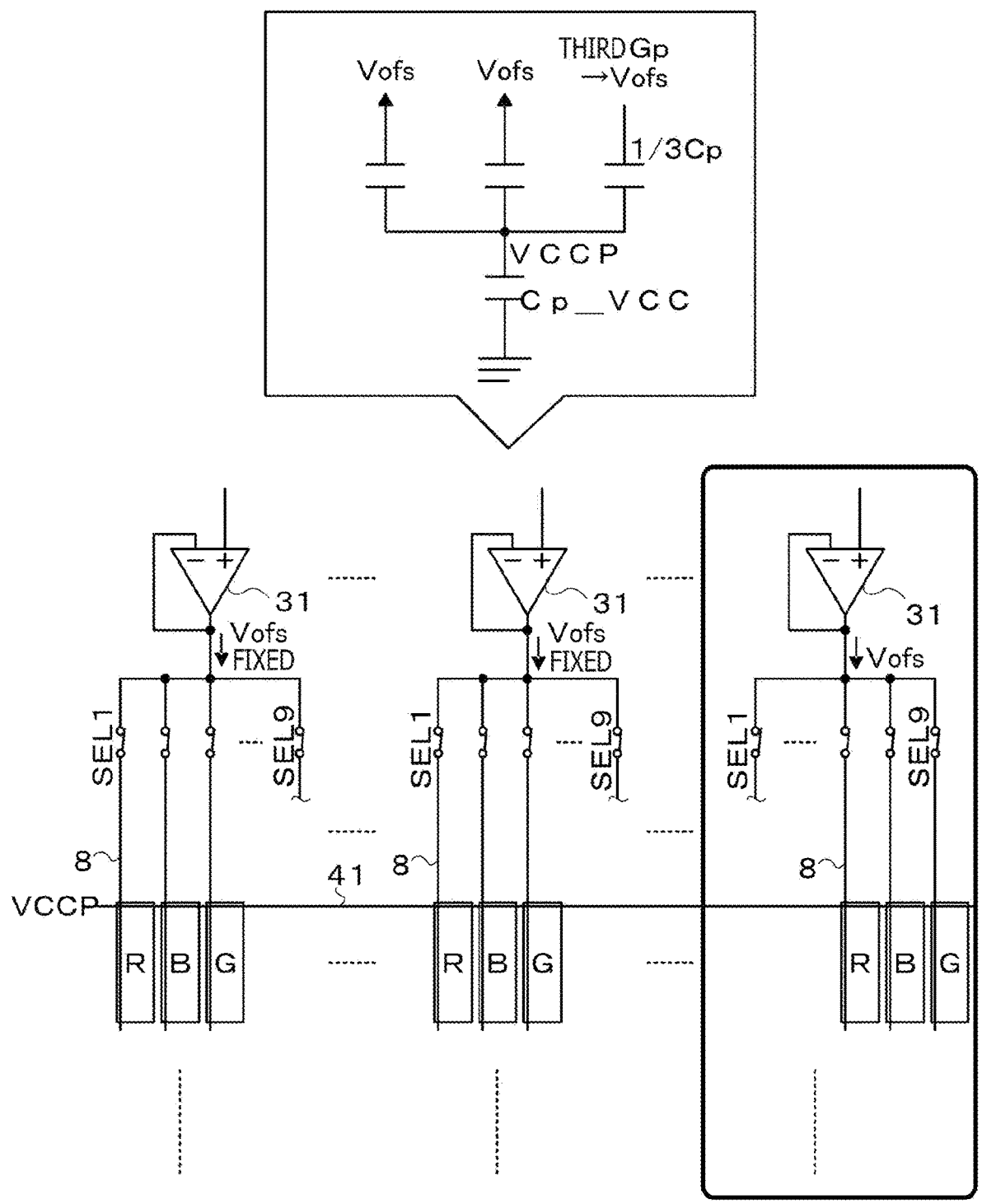
FIG. 12 is a diagram for describing the correction potential writing operation (third group).
Figure 13:
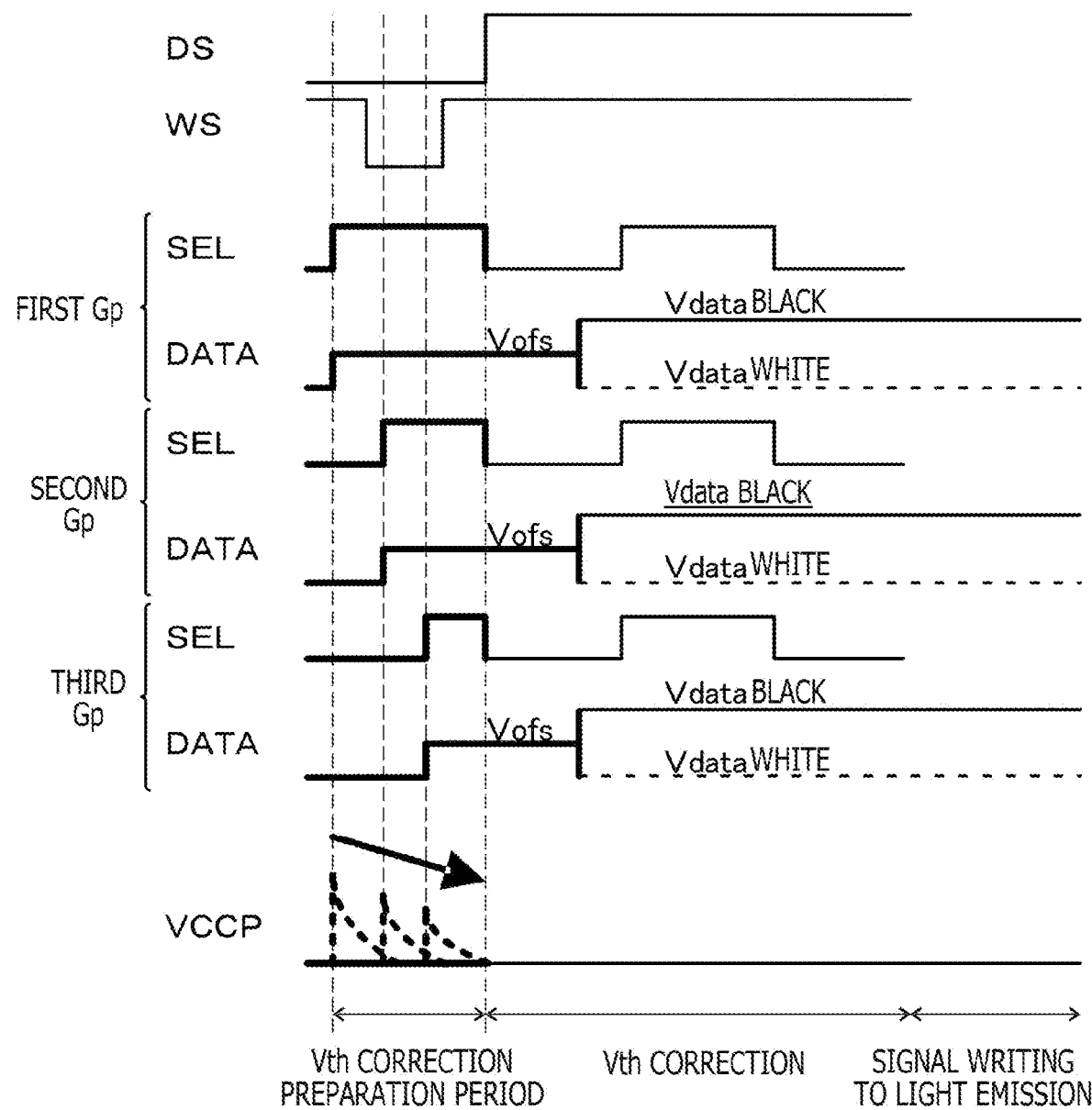
FIG. 13 is a diagram for describing a correction potential writing timing in the present embodiment.

FIGS. 10 to 12 are diagrams for describing writing operation of the reference voltage Vofs. FIG. 13 is a diagram for describing a writing timing of the reference voltage Vofs in the present embodiment. A description will be given of the case where the data lines 8 are divided into groups based on amplifiers, with reference to FIGS. 10 to 13. It should be noted that the case where the writing is performed by dividing the data lines 8 into three groups based on amplifiers will be described here. Here, the number of groups need only be two or more and may be a number other than three.

First, as illustrated in FIGS. 10 and 13, when the Vth correction preparation period begins, the selector switches SEL1 to SEL9 that are connected to the amplifiers 31 of the first group whose number is equal to "n/3" turn ON from an OFF state. This causes the reference voltage Vofs to be written to the data lines 8 of the first group that are connected to the selector switches SEL1 to SEL9 of the first group. It should be noted that the selector switches SEL1 to SEL9 of the second and third groups that are connected to the amplifiers 31 of the second and third groups whose number is equal to "2n/3" remain OFF and that no change occurs in the signal voltage Vdata that has been written to the data lines 8 on the previous vertical line. Here, as illustrated in FIG. 10, letting the parasitic capacitance C (vccp-data) between VCCP and DATA when the signal voltage Vdata changes to the reference voltage Vofs at the time of the writing in one operation be denoted as Cp, Cp/3 contributes to the VCCP fluctuation, which reduces a VCCP change at the time of the writing in one operation. Specifically, the fluctuation of the peak is reduced to one third.

Next, as illustrated in FIGS. 11 and 13, while the selector switches SEL1 to SEL9 of the first group to which the reference voltage Vofs has been written a while ago are ON and remain grounded to the reference voltage Vofs, the selector switches SEL1 to SEL9 of the second group which is a different group that are connected to the amplifiers 31 of the second group whose number is equal to "n/3" turn ON from the OFF state. This causes the reference voltage Vofs to be written to the data lines 8 of the second group that are connected to the selector switches SEL1 to SEL9 of the second group. Here, the selector switches SEL1 to SEL9 in the remaining third group that are connected to the amplifiers 31 of the third group whose number is equal to "n/3" remain OFF, and no change occurs in the signal voltage Vdata that has been written to the data lines 8 on the previous vertical line. Meanwhile, the selector switches SEL1 to SEL9 of the first group are fixed in the ON state even after the end of the writing of the reference voltage Vofs.

At this time, as illustrated in FIG. 11, the parasitic capacitance that affects the VCCP fluctuation by the second group is Cp/3 as in the above case of the first group. However, the selector switches SEL1 to SEL9 of the first group are grounded to the fixed power supply (specifically, voltage Vofs) even after the end of the writing, which contributes to the additional suppression of the VCCP change. This reduces the VCCP fluctuation more than in the above first group. Here, if the ratio of Cp to a parasitic capacitance Cp_VCC between the VCCP and another fixed power supply is reduced, the VCCP fluctuation is reduced. The grounding of the selector switches SEL1 to SEL9 of the first group to the fixed power supply even after the end of the writing translates into the additionally larger Cp_VCC. As a result, the ratio of Cp to Cp_VCC is reduced, which reduces the VCCP fluctuation. It should be noted that the fixed power supply to which the selector switches are grounded may be a power supply other than the reference voltage Vofs. Also, grounding may be achieved by means other than the selector switches SEL1 to SEL9.

Finally, as illustrated in FIGS. 12 and 13, while the selector switches SEL1 to SEL9 of the first and second groups are ON and remain grounded to the reference voltage Vofs, the selector switches SEL1 to SEL9 in the remaining third group that are connected to the amplifiers 31 of the third group whose number is equal to "n/3" turn ON from the OFF state. Then, the reference voltage Vofs is written to the data lines 8 of the third group that are connected to the selector switches SEL1 to SEL9 of the third group. This further reduces the VCCP fluctuation more than in the case of the above second group for a reason similar to the case of the second group.

It should be noted that the transistor DSTr is turned ON by the first control signal DS during the Vth correction preparation period as illustrated in FIG. 13. That is, the transistor DSTr is ON when the reference voltage Vofs is written. This causes one of electrodes of the drive transistor DRTr to be grounded to the fixed power supply (specifically, VCCP) via the transistor DSTr, which makes it possible to additionally increase Cp_VCC. Accordingly, it is possible to reduce the VCCP fluctuation by reducing the above ratio of Cp to Cp_VCC. It should be noted that the transistor DSTr may be turned OFF during the Vth correction preparation period.

As a result, the VCCP change is suppressed as a whole, as illustrated by the bold dashed line waveform in FIG. 13, which makes it possible to suppress occurrence of the above crosstalk. The writing on a group-by-group basis can suppress the peak of the fluctuation, and the writing in an overlapping manner can reduce the length of time required to eliminate the fluctuation. The number of divisions and the writing timing are set as appropriate commensurate with allowable length of time for the Vth correction preparation period and the like.

It should be noted that the writing need not be performed in the order from the first group to the second group to the third group. For example, the writing may be performed in the order from the first group to the third group to the second group. Also, the writing periods of the reference voltage Vofs of the respective groups during the Vth correction preparation period may or may not overlap with each other. That is, the writing may be performed before or after the elimination of the power fluctuation of the previous group.

Figure 14:
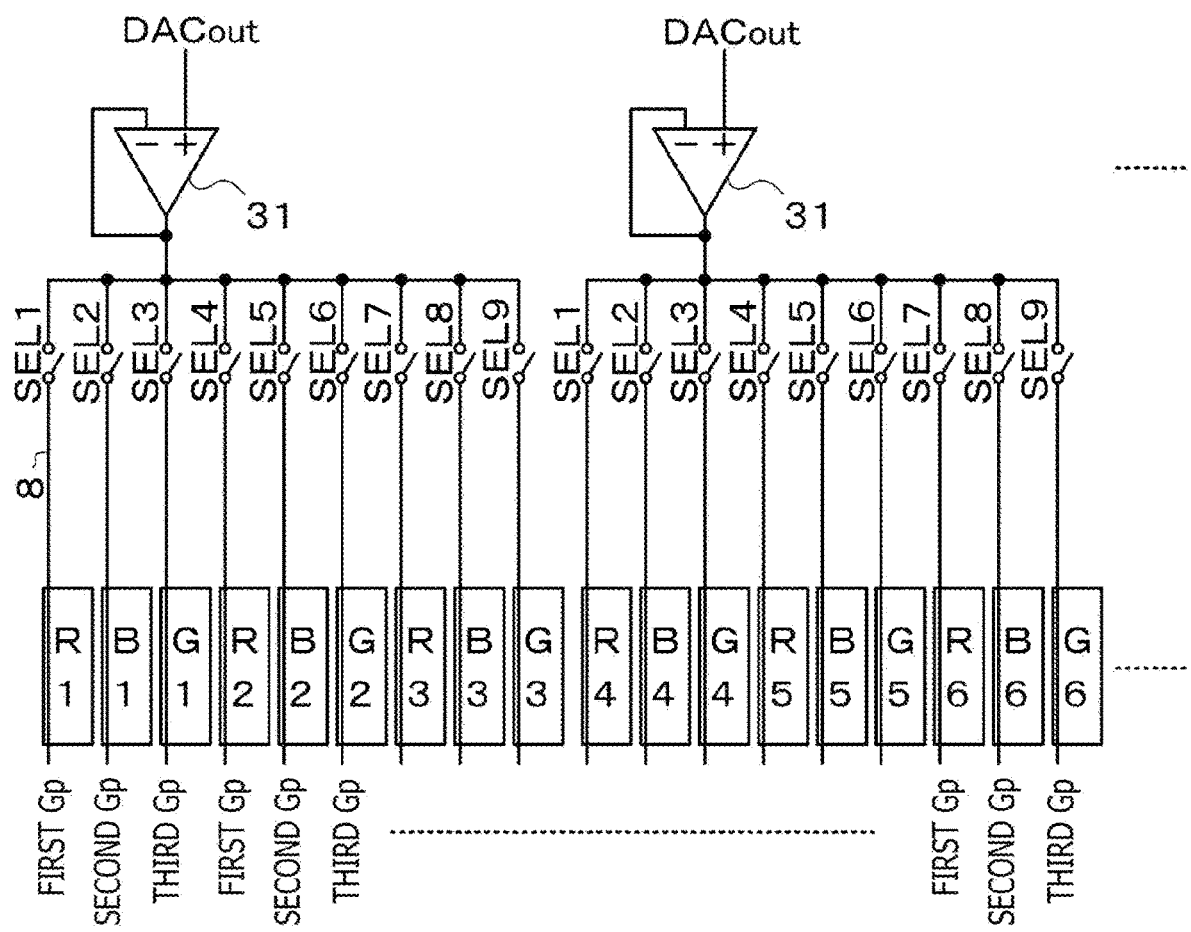
FIG. 14 is a diagram for describing division into groups by color.
Figure 15:
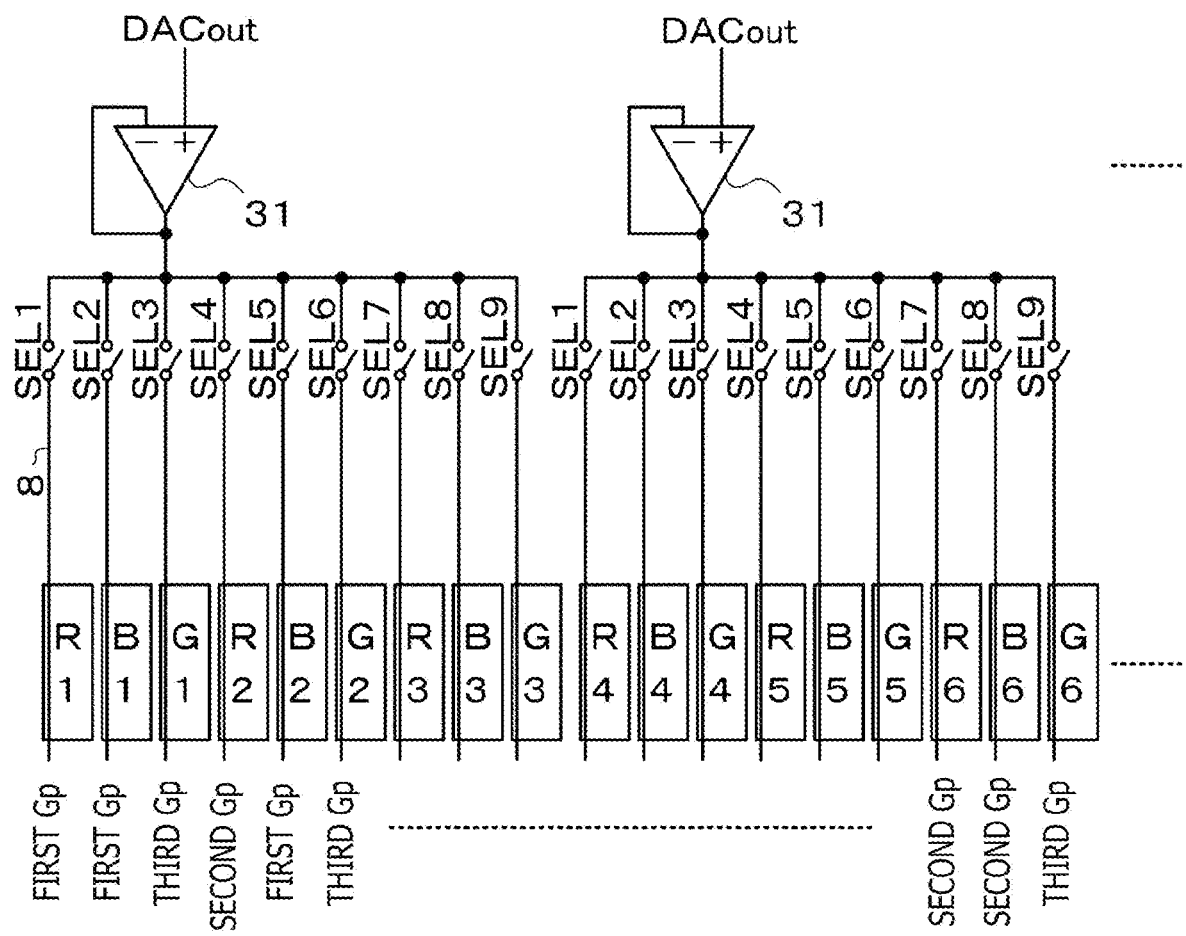
FIG. 15 is a diagram for describing the division into groups in another way.

The way of dividing the data lines 8 into groups is not limited to the division into groups based on amplifiers. As illustrated in FIG. 14, the data lines 8 may be divided into groups based on pixel colors to which the pixel circuits correspond. Also, rather than dividing them regularly, that is, dividing them into groups based on amplifiers, colors, or the like, the data lines 8 may be divided into groups irregularly as illustrated in FIG. 15. Also, as in the case described above, the number of data lines 8 may be the same in each group. Alternatively, the number of data lines 8 may be different among the divided groups. That is, the data lines 8 need only be divided into two or more groups. In any case, it is possible to suppress the occurrence of crosstalk as in the case of the division into groups based on amplifiers described above.

As described above, the organic EL display apparatus 1 can suppress the power fluctuation by writing the correction potential for correcting Vth of the drive transistor DRTr to the data lines 8 that are divided into groups, on a group-by-group basis. This suppresses the luminance change caused by the power fluctuation that occurs partially on the screen, which makes it possible to improve the deterioration of the image quality. Because the fixed power supply is grounded after the writing of the correction potential, it is possible to reduce the power fluctuation as compared to the case where the fixed power supply is not grounded (specifically, in the case where the selector switches SEL1 to SEL9 are turned OFF after the writing) as described above. The selector switches SEL1 to SEL9 sample, in a time-shared manner, the signal voltages of the data signals commensurate with the gray scale level that are input chronologically following the correction potential and write the signal voltages to the data lines 8, which makes it unnecessary to form a new circuit for writing the correction potential to the pixel circuit 4*a*.

3. MODIFICATION EXAMPLES

Although the embodiment of the present technology have been specifically described, the present technology is not limited to each of the above embodiments, and a variety of modifications based on a technical idea of the present technology can be made. For example, a variety of modifications such as those which will be described next can be made. Also, one or a plurality of freely-selected aspects of the modifications which will be described next can be combined as appropriate. Also, the configurations, methods, processes, shapes, materials, values, and the like of the above embodiment can be combined without departing from the gist of the present technology.

In the above embodiment, only p-channel transistors are used as the transistors. However, only n-channel transistors may be used as the transistors. Also, p- and n-channel transistors may be combined as appropriate.

Although the OLED which is a light-emitting element is illustrated as an electro-optical element in the above embodiment, any other element that emits light at luminance commensurate with a current, such as an inorganic light-emitting diode or an LED (Light Emitting Diode), may also be used.

Although the case where the writing to all the pixel circuits of the horizontal line is performed through the line-by-line writing is illustrated in the above embodiment, the present technology is not limited thereto, and one line may be divided into multiple parts (e.g., two equal parts) such that the writing to each part is performed.

Although the pixel circuit 4*a* in FIG. 4 is illustrated as the pixel circuit to which the present technology is applicable in the above embodiment, the pixel circuit is not limited thereto. For example, the present technology may be applied to the following pixel circuits.

Figure 16:
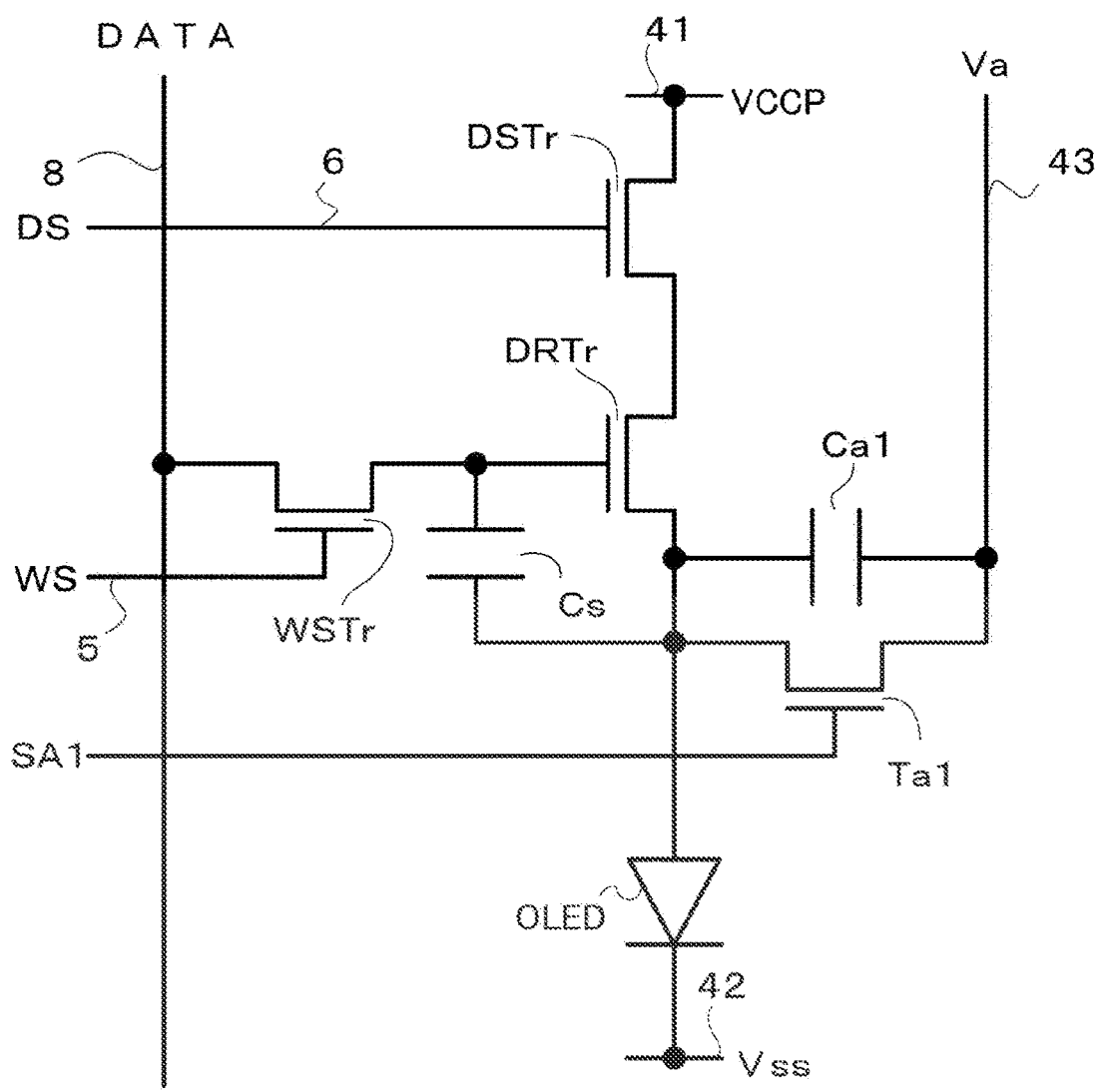
FIG. 16 is a diagram illustrating an example of a configuration of the pixel circuit to which the present technology is applicable.

FIG. 16 is a diagram illustrating an example of a configuration of the pixel circuit to which the present technology is applicable. A pixel circuit 4*b* illustrated in FIG. 16 includes the four transistors (the drive transistor DRTr, the transistor WSTr, the transistor DSTr, and a transistor Ta1), the retention capacitance Cs, a transfer capacitance Ca1, and the OLED. It should be noted that an n-channel transistor is used here as the drive transistor DRTr.

The drive transistor DRTr has the drain connected to the power feed line 41 via the transistor DSTr and the source connected to the anode of the OLED and controls the current flowing through the OLED. The cathode of the OLED is connected to the power line 42. The transistor WSTr has the gate connected to the first scan line 5, one of the source and the drain connected to the data line 8, and the other of the source and the drain connected to the gate of the drive transistor DRTr. The transistor DSTr has the gate connected to the second scan line 6, one of the source and the drain connected to the power feed line 41, and the other of the source and the drain connected to the drain of the drive transistor DRTr and controls the supply of power to the drive transistor DRTr. The transistor Ta1 has a gate connected to the control line (control line to which a control signal SA1 is supplied), one of a source and a drain connected to the source of the drive transistor DRTr and the anode of the OLED, and the other of the source and the drain connected to a power line 43. It should be noted that the transfer capacitance Ca1 is connected in parallel to the transistor Ta1. The transistor Ta1 plays a role of initializing or sensing the node located between the drive transistor DRTr and the OLED in response to the control signal SA1. The retention capacitance Cs is connected between the gate and the source of the drive transistor DRTr and retains a gate-to-source voltage Vgs of the drive transistor DRTr.

Figure 17:
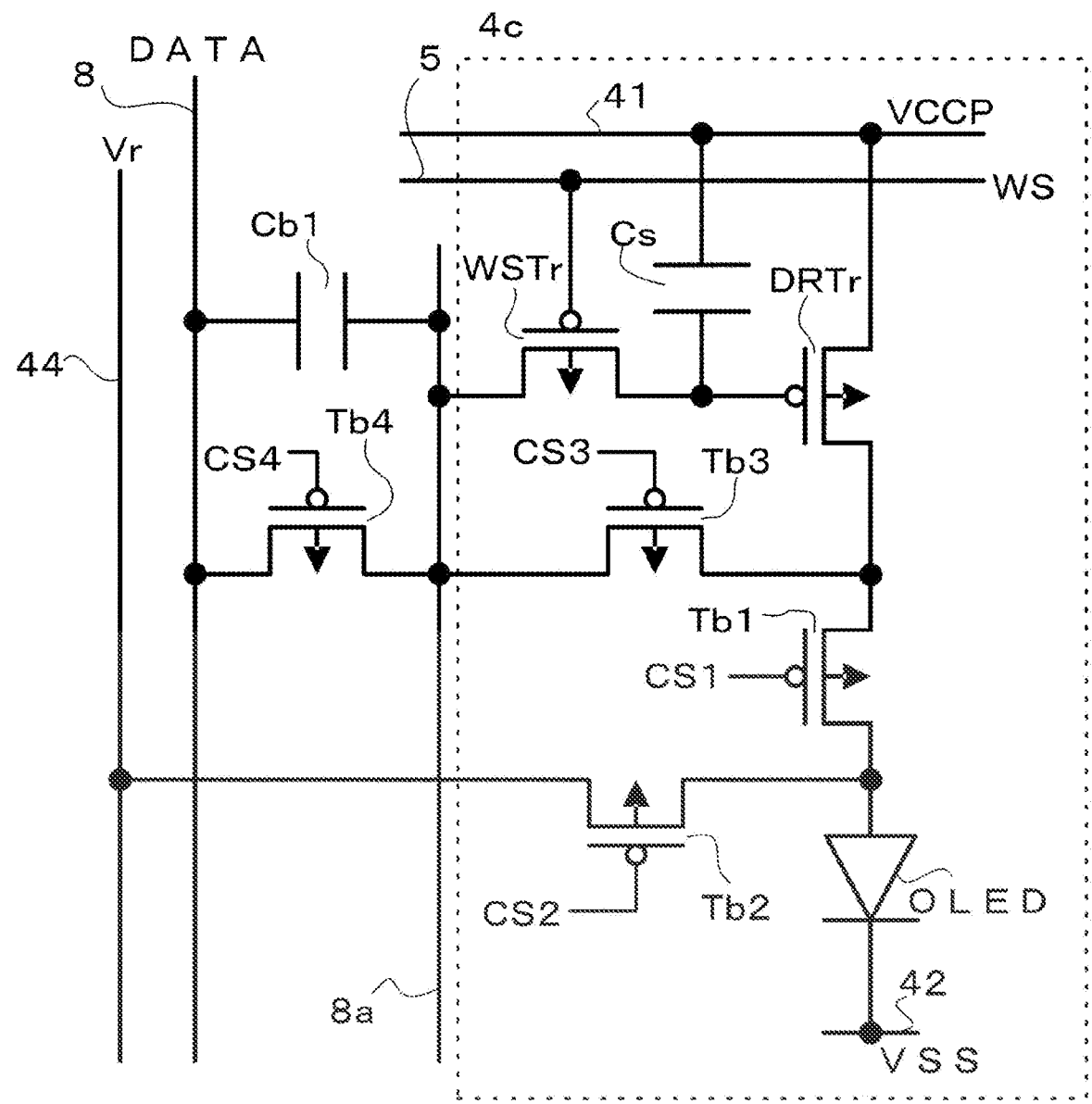
FIG. 17 is a diagram illustrating an example of a configuration of the pixel circuit to which the present technology is applicable.

FIG. 17 is a diagram illustrating an example of a configuration of the pixel circuit to which the present technology is applicable. The connection configuration of a pixel circuit 4*c* illustrated in FIG. 17 includes six transistors (the drive transistor DRTr, the transistor WSTr, a transistor Tb1, a transistor Tb2, a transistor Tb3, and a transistor Tb4), the retention capacitance Cs, a transfer capacitance Cb1, and the OLED.

The drive transistor DRTr has the source connected to the power feed line 41 and the drain connected to the anode of the OLED via the transistor Tb1 and controls the current flowing through the OLED. The cathode of the OLED is connected to the power line 42. The transistor WSTr has the gate connected to the first scan line 5, one of the source and the drain connected to a data line 8*a*, and the other of the source and the drain connected to the gate of the drive transistor DRTr. A control signal CS1 is input to a gate of the transistor Tb1 to control a region between the drain of the drive transistor DRTr and the anode of the OLED to be turned ON or OFF. A control signal CS2 is input to a gate of the transistor Tb2, and the transistor Tb2 supplies a reset potential Vr which is the potential of a power line 44 to the anode of the OLED, according to the control signal CS2. The difference between the reset potential Vr and the common potential Vss is set lower than a light emission threshold of the OLED. The transistor Tb3 has one of a source and a drain connected to the data line 8 and the other of the source and the drain connected to the drain of the drive transistor DRTr. A control signal CS3 is given to a gate of the transistor Tb3. The transistor Tb3 functions as a switching transistor that controls the connection between the gate and the source of the drive transistor DRTr.

The transistor Tb4 has one of a source and a drain connected to the data line 8 and the other of the source and the drain connected to the data line 8*a*. A control signal CS4 is input to a gate of the transistor Tb4. The transistor Tb4 functions mainly as a switching transistor that controls the connection between the data line 8 and the data line 8*a*. The transfer capacitance Cb1 is connected between the data line 8 and the data line 8a as is the transistor Tb4. Here, the transistor Tb4 and the transfer capacitance Cb1 are shared by the pixel circuits 4c that are connected to the same data line 8a.

Figure 18:
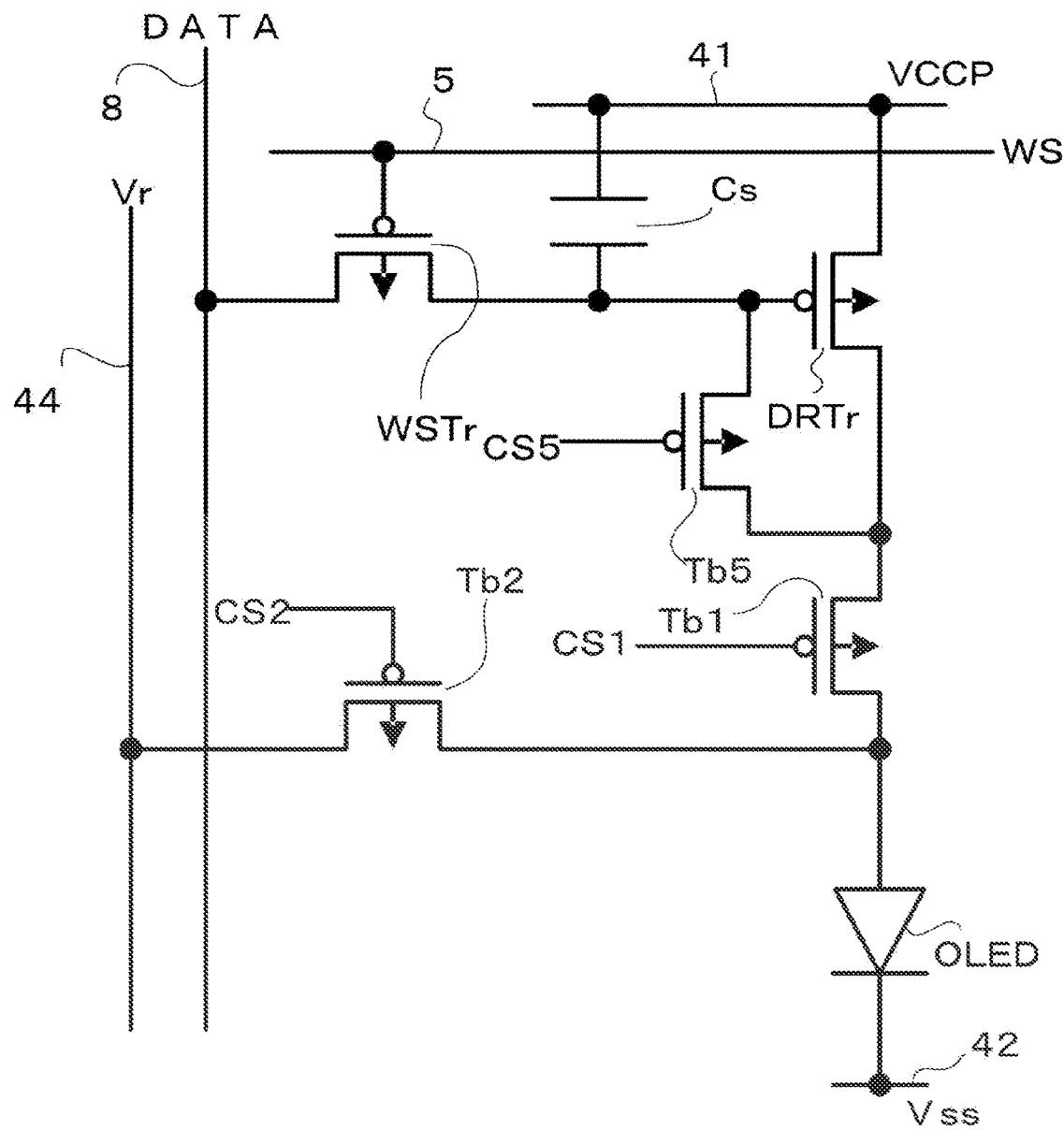
FIG. 18 is a diagram illustrating an example of a configuration of the pixel circuit to which the present technology is applicable.

FIG. 18 is a diagram illustrating an example of a configuration of the pixel circuit to which the present technology is applicable. A pixel circuit 4d illustrated in FIG. 18 includes five transistors (the drive transistor DRTr, the transistor WSTr, the transistor Tb1, the transistor Tb2, and a transistor Tb5), the retention capacitance Cs, and the OLED.

The drive transistor DRTr has the source connected to the power feed line 41 and the drain connected to the anode of the OLED via the transistor Tb1 and controls the current flowing through the OLED. The cathode of the OLED is connected to the power line 42. The transistor WSTr has the gate connected to the first scan line 5, one of the source and the drain connected to the data line 8, and the other of the source and the drain connected to the gate of the drive transistor DRTr. The control signal CS1 is input to the gate of the transistor Tb1 to control the region between the drain of the drive transistor DRTr and the anode of the OLED to be turned ON or OFF. The control signal CS2 is input to the gate of the transistor Tb2, and the transistor Tb2 supplies the reset potential Vr which is the potential of the power line 44 to the anode of the OLED, according to the control signal CS2. The transistor Tb5 is connected between the gate and the drain of the drive transistor DRTr, and a control signal CS5 is input to a gate of the transistor Tb5. The transistor Tb5 short-circuits the region between the gate and the drain of the drive transistor DRTr, according to the control signal CS5, and compensates for the variations of the threshold of the drive transistor DRTr. The retention capacitance Cs is connected between the gate of the drive transistor DRTr and the power feed line 41 and retains the gate-to-source voltage Vgs of the drive transistor DRTr.

The present technology is applicable not only to the pixel section 4 illustrated in FIG. 5 but also to the pixel circuits including the drive transistor that controls the current flowing through the current-driven light-emitting element as illustrated in FIGS. 16 to 18 and provides the advantageous effect described above. It should be noted that the writing of the correction potential by using the data lines (e.g., data lines 8) for writing the data signal eliminates the need for providing separately a pixel circuit for correcting Vth. However, in the case where a circuit for writing the correction potential is provided separately from the data line for writing the data signal, the present technology is also applicable to the writing of the correction potential by the circuit.

4. APPLICATION EXAMPLE

A description will be given next of electronic equipment to which the electro-optical apparatus according to the embodiment or the like or an application example is applied. The electro-optical apparatus is suited for high-definition display using small pixels. Therefore, the electronic equipment is applicable as a display apparatus of a head-mounted display, smart eyeglasses, a smartphone, a digital camera's electronic viewfinder, and the like.

It should be noted that the present technology can also have the following configurations.

(1)
An electro-optical apparatus including:
selector switches each of which is provided for each data line, one data line being disposed for each pixel column of a pixel section that includes pixel circuits arranged in a matrix form, each of the pixel circuits including a drive transistor and a light-emitting element that emits light at luminance that is commensurate with a magnitude of a current supplied via the drive transistor, each of the selector switches writing an input data signal to the data lines, in which
the selector switches write a correction potential for correcting a threshold voltage of the drive transistor to the data lines that are divided into groups, at a timing different for each group.

(2)
The electro-optical apparatus of feature (1), in which
the data lines to which the correction potential has been written are grounded to a fixed power supply.

(3)
The electro-optical apparatus of feature (1) or (2), in which
input nodes of the selector switches are connected together for each plurality of the data lines, an amplifier for inputting the data signal to the selector switches is connected to an input side where the input nodes are connected together, and the data lines are divided into the groups based on the amplifiers.

(4)
The electro-optical apparatus of feature (1) or (2), in which
the data lines are divided into the groups based on pixel colors to which the pixel circuits correspond.

(5)
The electro-optical apparatus of any one of features (1) to (4), in which
the selector switches sample, in a time-shared manner, data signals that are input chronologically following the correction potential and whose potentials are commensurate with a gray scale level and write the sampled data signals to the data lines.

(6)
The electro-optical apparatus of any one of features (1) to (5), in which
each of the pixel circuits further includes
a first transistor connected between the data line and a gate electrode of the drive transistor, and
a retention capacitance adapted to retain a signal voltage of the data signal written via the first transistor.

(7)
The electro-optical apparatus of any one of features (1) to (6), in which
each of the pixel circuits further includes a second transistor connected between a power feed line and the drive transistor, and
the second transistor is turned ON when the correction potential is written.

(8)
The electro-optical apparatus of any one of features (1) to (7), in which
writing periods of the correction potentials of the respective groups overlap.

(9)
The electro-optical apparatus of any one of features (1) to (7), in which
writing periods of the correction potentials of the respective groups do not overlap.

(10)
The electro-optical apparatus of any one of features (1) to (9), in which
the number of data lines is same in each of the divided groups.

(11)
The electro-optical apparatus of any one of features (1) to (9), in which
the number of data lines is different among the divided groups.
(12)
Electronic equipment including:
the electro-optical apparatus of feature (1).
(13)
A driving method of an electro-optical apparatus, the driving method including:
dividing, into groups, data lines that are disposed one for each pixel column of a pixel section that includes pixel circuits that are arranged in a matrix form, each of the pixel circuits including a drive transistor and a light-emitting element that emits light at luminance that is commensurate with a magnitude of a current supplied via the drive transistor; and
writing a correction potential for correcting a threshold voltage of the drive transistor to the data lines, at a timing different for each group.

REFERENCE SIGNS LIST

1: Organic EL display apparatus
2: Vertical drive circuit
3: Horizontal drive circuit
4: Pixel section
4a, 4b, 4c, 4d: Pixel circuit
5: First scan line
6: Second scan line
7: Third scan line
8, 8a: Data line
10: Drive section
31: Amplifier
41: Power feed line
42: Power line
SEL1 to SEL9: Selector switches
DRTr: Drive transistor
WSTr, DSTr, AZTr: Transistor
Cs: Retention capacitance
Csub: Auxiliary capacitance
OLED: Light-emitting element

The invention claimed is:
1. An electro-optical apparatus, comprising:
a plurality of selector switches;
a plurality of data lines, wherein
 each of the plurality of selector switches corresponds to each of the plurality of data lines,
 each of a plurality of input nodes of each of the plurality selector switches are connected together for each of the plurality of data lines;
a pixel section that includes a plurality of pixel circuits in a matrix form, wherein
 each of the plurality of data lines corresponds to each of a plurality of pixel columns of the plurality of pixel circuits in the matrix form,
 each of the plurality of pixel circuits includes:
  a drive transistor, and
  a light-emitting element configured to emit light at luminance that is commensurate with a magnitude of a current via the drive transistor, and
 each of the plurality of selector switches is configured to:
  write a data signal to a respective data line of the plurality of data lines, and
  write, to the respective data line, a correction potential to correct a threshold voltage of the drive transistor, wherein
  the plurality of data lines includes a plurality of groups of data lines,
  a time at which the correction potential is written is different for each of the plurality of groups of data lines,
  the plurality of selector switches includes a plurality of groups of selector switches, and
  each of the plurality of groups of selector switches corresponding to the each of the plurality of groups of data lines is different; and
a plurality of amplifiers, wherein
 each of the plurality of amplifiers corresponds to each of the plurality of groups of selector switches,
 each of the plurality of amplifiers is configured to input the data signal to a respective group of selector switches of the plurality of groups of selector switches from the plurality of input nodes, and
 the plurality of groups of data lines are based on each of the plurality of amplifiers.
2. The electro-optical apparatus of claim 1, wherein the respective data line of the plurality of data lines is grounded to a fixed power supply.
3. The electro-optical apparatus of claim 1, wherein
the plurality of groups of data lines are based on a pixel color to which each of the plurality of pixel circuits correspond.
4. The electro-optical apparatus of claim 1, wherein
each of the plurality of selector switches are further configured to sample, in a time-shared manner, a plurality of data signals,
the plurality of data signals is input chronologically to follow the correction potential,
a potential of each of the plurality of data signals are commensurate with a gray scale level, and
write each of the plurality of sampled data signals to each of the plurality data lines.
5. The electro-optical apparatus of claim 1, wherein each of the plurality of pixel circuits further includes:
a first transistor is configured to receive the data signal of the plurality of data signals, wherein the first transistor is between the respective data line and a gate electrode of the drive transistor, and
a retention capacitance configured to retain a signal voltage of the data signal.
6. The electro-optical apparatus of claim 1, wherein
each of the plurality of pixel circuits further includes a second transistor between a power feed line and the drive transistor, and
the second transistor is configured to turn ON when the correction potential is written.
7. The electro-optical apparatus of claim 1, wherein
a writing period of the correction potential of each of the plurality of groups of data lines overlap.
8. The electro-optical apparatus of claim 1, wherein
a writing period of the correction potential of each of the plurality of groups of data lines do not overlap.
9. The electro-optical apparatus of claim 1, wherein
a number of data lines is same in each of the plurality of groups of data lines.
10. The electro-optical apparatus of claim 1, wherein
a number of data lines is different in each of the plurality of groups of data lines.
11. An electronic equipment, comprising:
an electro-optical apparatus that includes:

a plurality of selector switches;
a plurality of data lines, wherein
 each of the plurality of selector switches corresponds to each of the plurality of data lines,
 each of a plurality of input nodes of each of the plurality selector switches are connected together for each of the plurality of data lines;
a pixel section that includes a plurality of pixel circuits in a matrix form, wherein
 each of the plurality of data lines corresponds to each of a plurality of pixel columns of the plurality of pixel circuits in the matrix form,
 each of the plurality of pixel circuits includes:
  a drive transistor, and
  a light-emitting element configured to emit light at luminance that is commensurate with a magnitude of a current via the drive transistor, and
 each of the plurality of selector switches is configured to:
  write a data signal to a respective data line of the plurality of data lines, and
  write, to the respective data line, a correction potential to correct a threshold voltage of the drive transistor, wherein
  the plurality of data lines includes a plurality of groups of data lines,
  a time at which the correction potential is written is different for each of the plurality of groups of data lines,
  the plurality of selector switches includes a plurality of groups of selector switches, and
  each of the plurality of groups of selector switches corresponding to the each of the plurality of groups of data lines is different; and
a plurality of amplifiers, wherein
 each of the plurality of amplifiers corresponds to each of the plurality of groups of selector switches,
 each of the plurality of amplifiers is configured to input the data signal to a respective group of selector switches of the plurality of groups of selector switches from the plurality of input nodes, and
 the plurality of groups of data lines are based on each of the plurality of amplifiers.

12. A driving method of an electro-optical apparatus, the driving method comprising:
dividing a plurality of selector switches into a plurality of groups of selector switches;
dividing a plurality of data lines into a plurality of groups of data line corresponds to the groups of selector switches, wherein
 each of the plurality of data lines is corresponds to each of a plurality of pixel columns of a plurality of pixel circuits in a matrix form,
 each of a plurality of input nodes of each of the plurality selector switches are connected together for each of the plurality of data lines, and
 each of the plurality of pixel circuits includes a drive transistor and a light-emitting element;
inputting, by each of a plurality of amplifiers, a data signal to a respective group of selector switches of the plurality of groups of selector switches from the plurality of input nodes, wherein
 each of the plurality of amplifiers corresponds to each of the plurality of groups of selector switches, and
 the plurality of groups of data lines are based on each of the plurality of amplifiers;
supplying, by the drive transistor, a current to the light-emitting element;
emitting, by the light-emitting element light at luminance that is commensurate with a magnitude of the supplied current by the drive transistor; and
writing, by each of the plurality of selector switches, a correction potential to each of the plurality of data lines, wherein
 the correction potential is for correcting a threshold voltage of the drive transistor,
 a time at which the correction potential is written is different for each of the plurality of groups of data lines, and
 each of the plurality of groups of selector switches corresponds to the each of the plurality of groups of data lines is different.

* * * * *